(12) United States Patent
Wilson et al.

(10) Patent No.: US 9,954,527 B2
(45) Date of Patent: Apr. 24, 2018

(54) BALANCED CHARGE-RECYCLING REPEATER LINK

(71) Applicant: NVIDIA Corporation, Santa Clara, CA (US)

(72) Inventors: John Michael Wilson, Wake Forest, NC (US); John W. Poulton, Chapel Hill, NC (US); Matthew Rudolph Fojtik, Raleigh, NC (US); Carl Thomas Gray, Apex, NC (US)

(73) Assignee: NVIDIA Corporation, Santa Clara, CA (US)

( * ) Notice: Subject to any disclaimer, the term of this patent is extended or adjusted under 35 U.S.C. 154(b) by 14 days.

(21) Appl. No.: 14/869,759

(22) Filed: Sep. 29, 2015

(65) Prior Publication Data

US 2017/0093403 A1    Mar. 30, 2017

(51) Int. Cl.
*H03K 19/0175* (2006.01)
*H03K 19/0185* (2006.01)

(52) U.S. Cl.
CPC ............................. *H03K 19/018528* (2013.01)

(58) Field of Classification Search
CPC .............................................. H03K 19/018528
USPC .......................................................... 326/68
See application file for complete search history.

(56) References Cited

U.S. PATENT DOCUMENTS

| | | | | |
|---|---|---|---|---|
| 4,860,257 A * | 8/1989 | Choi | ..................... | G11C 7/1051 365/189.11 |
| 7,329,968 B2 * | 2/2008 | Shepard | ..................... | H02J 1/08 307/18 |
| 7,443,223 B2 * | 10/2008 | Bajkowski | ....... | H03K 3/356121 326/68 |
| 7,750,717 B2 * | 7/2010 | Ali | ................ | H03K 19/018521 326/63 |
| 7,772,885 B1 * | 8/2010 | Lin | .................. | H03K 3/356113 326/68 |
| 7,839,170 B1 * | 11/2010 | Yang | ................ | H03K 3/356182 326/68 |
| 7,876,631 B2 * | 1/2011 | Chai | ....................... | G11C 7/08 365/189.12 |
| 8,278,969 B2 * | 10/2012 | Ng | .................. | H03K 3/356121 326/68 |
| 8,629,705 B2 * | 1/2014 | Chang | .................... | H02M 3/07 327/333 |

(Continued)

OTHER PUBLICATIONS

Liu, Y. et al., "A 0.1pJ/b 5-to-10Gb/s Charge-Recycling Stacked Low-Power I/O for On-Chip Signaling in 45nm CMOS SOI," IEEE International Solid-State Circuits Conference, 2013, pp. 400-401 and continuation page.

*Primary Examiner* — Don Le
(74) *Attorney, Agent, or Firm* — Zilka-Kotab, PC

(57) ABSTRACT

A balanced, charge-recycling repeater link is disclosed. The link includes a first set of segments operating in a first voltage domain and a second set of segments operating in a second voltage domain. The link is configured to transmit a first signal over at least one segment in the first set of segments and at least one other segment in the second set of segments. Each segment of the link includes at least one active circuit element configured to charge or discharge one or more corresponding interconnects within the link and a level shifter configured to shift the level of a signal on a last interconnect of the segment from the first voltage domain to the second voltage domain or the second voltage domain to the first voltage domain.

20 Claims, 17 Drawing Sheets

(56) References Cited

U.S. PATENT DOCUMENTS

| | | | |
|---|---|---|---|
| 8,797,084 B2 * | 8/2014 | Friedman | H03K 19/0019 326/33 |
| 8,868,836 B2 * | 10/2014 | Khellah | G11C 5/14 711/129 |
| 8,947,149 B1 * | 2/2015 | Kapoor | G06F 1/10 327/293 |

* cited by examiner

US 9,954,527 B2

BALANCED CHARGE-RECYCLING REPEATER LINK

This invention was made with Government support under LLNS subcontract B609478 awarded by DOE, and with Government support under Agreement HR0011-13-3-0001 awarded by DARPA. The Government has certain rights in this invention.

FIELD OF THE INVENTION

The present invention relates to integrated circuits, and more particularly to techniques for reducing the power dissipation associated with interconnects of integrated circuits.

BACKGROUND

Integrated circuits utilize interconnects to transmit signals from one portion of the circuit to another portion of the circuit. Interconnects within an integrated circuit typically comprise wires formed in a metal layer of the integrated circuit. Each wire is associated with a resistance and a capacitance that is related to the physical design of the wire (e.g., cross section, length, etc.). Transmitting signals on these wires is not instantaneous. Changing a signal on the wire requires the wire to be charged or discharged. There is a time delay for a signal to travel down a wire that is characterized by an RC factor associated with the wire (i.e., a resistance of the wire in ohms multiplied by a capacitance of the wire). Because both resistance of a wire and capacitance of a wire increase linearly with a wire's length, the time delay increases as a square of the wires length.

In order to decrease the time delay associated with a long interconnect, active circuit(s) can be introduced along the long interconnect to break the long interconnect up into multiple shorter interconnects. Because the time delay of the short interconnects, added together, is less than the time delay of the long interconnect, a relatively faster link can be provided over the same linear distance of the integrated circuit. FIG. 1 illustrates a conventional CMOS (Complementary Metal Oxide Semiconductor) repeater link 100, in accordance with the prior art. The link 100 includes a plurality of interconnects (e.g., 112, 114, 116, 118, etc.) connected to a number of repeaters (e.g., 102, 104, 106, etc.). The repeaters shown in FIG. 1 are conventional CMOS inverters. It will be appreciated that an even number of repeaters (and an odd number of interconnects) may be used to ensure the signal at the end of the link 100 is the same as the signal at the beginning of the link 100.

The link 100 may be used to transmit a signal, A, from one end of the link 100 to the other end of the link 100. For example, the interconnect 112 may be charged to high potential ($V_{dd}$) to match a logic high state of signal A. The inverter 102 then discharges interconnect 114 to a low potential ($V_{ss}$) to match an inverted state of signal A, i.e., a logic low state of signal $\overline{A}$. The inverter 104 then charges interconnect 116 to a high potential ($V_{dd}$) to match an inverted state of signal $\overline{A}$, i.e., a logic high state of signal A. The inverter 106 then discharges interconnect 118 to a low potential ($V_{ss}$) to match an inverted state of signal A, i.e., a logic low state of signal $\overline{A}$, and so forth until the end of the link is reached and the last interconnect is charged to a high potential ($V_{dd}$) to match a logic high state of signal A at the beginning of the link 100.

A common way to define the power dissipation of conventional CMOS repeater links, such as the link 100 of FIG. 1, is shown in Equation 1.

$$P = A*F*C*V^2 \qquad \text{(Eq. 1)}$$

In Equation 1, the term A refers to an activity factor of the data, the term F refers to a frequency of the data clock, the term C refers to a capacitance of the wire, and the term V refers to a voltage swing of the signal, which is typically between a low supply voltage, $V_{ss}$ (i.e., a ground potential), and a high supply voltage, $V_{dd}$. The activity factor of the data refers to a relative measurement of the number of transitions between logic low and logic high of the signal relative to a number of transitions of the data clock. For example, a signal representing a clock, where the signal has alternating positive or negative transitions during each period of the data clock (e.g., 1010101010101010 . . . ) would have an activity factor of 1. The activity factor may be lower where there are very few transitions in the signal (e.g., 00000000111111110000000011 . . . ).

It will be appreciated that the power dissipation depends on the square of the voltage swing on the interconnects of the link 100. One technique for reducing the power dissipation in the links is to reduce the magnitude of the voltage swing in the voltage domain utilized by the link. For example, reducing the voltage swing from 5V to 3V would reduce the power dissipation by more than 60%. Another technique that has been proposed is to split the voltage domain into two voltage domains and stack the links such that each link utilizes a voltage domain associated with a voltage swing of half the magnitude compared to a voltage swing associated with the full-scale voltage domain, a technique known as charge-recycling.

FIG. 2 illustrates a pair of stacked CMOS repeater links 200, in accordance with the prior art. The pair of stacked CMOS repeater links 200 includes a first link in a first voltage domain and a second link in a second voltage domain. As shown in FIG. 2, the first link includes a plurality of interconnects (e.g., 211, 213, 215, 217, etc.) connected to a number of repeaters (e.g., 201, 203, 205, etc.). The first link operates in a first voltage domain having a high supply voltage of $V_{dd}$ and a low supply voltage of $$\frac{V_{dd}}{2},$$

which is provided by a voltage regulator 220, such as the op amp coupled to a pair of equally sized resistors (each labeled R) placed in series between the high supply voltage and the low supply voltage. The voltage regulator is required to keep the mid-range supply voltage $$\frac{V_{dd}}{2}$$

stable. Without the voltage regulator, the mid-range supply voltage could drift due to the uneven charging and discharging of the interconnects in the pair of stacked CMOS repeater links 200 based on the uneven transitions between the pair of signals transmitted over the pair of links. The second link includes a plurality of interconnects (e.g., 212, 214, 216, 218, etc.) connected to a number of repeaters (e.g., 202, 204, 206, etc.). The second link operates in a second voltage domain have a high supply voltage of $\frac{V_{dd}}{2}$ and a low supply voltage of $V_{ss}$ (e.g., a ground potential). Again, the repeaters shown in FIG. 2 are conventional CMOS inverters. It will be appreciated that an even number of repeaters (and an odd number of interconnects) may be used to ensure the signals at the end of the pair of stacked CMOS repeater links 200 are the same as the signals at the beginning of the pair of stacked CMOS repeater links 200.

The stacked CMOS repeater links 200 can be used to transmit a pair of signals (A/B) in a similar manner of the link 100, described above. The signal A may be transmitted in the first voltage domain, and the signal B may be transmitted in the second voltage domain. Because signals A and B are independent signals, the state of signal A and the state of signal B will transition differently such that both A and B can be both logic high, both logic low, or one logic high and one logic low at any given time t. Given that the transitions for signals A/B are different, the inverters (e.g., 201, 202, 203, 204, 205, 206, etc.) will charge or discharge the interconnects (e.g., 211, 212, 213, 214, 215, 216, 217, 218, etc.) in an uneven manner based on the states of the signals, which could cause the mid-range supply voltage to drift without the inclusion of the voltage regulator 220.

Stacking the links in the manner shown in FIG. 2 will reduce power dissipation of the link due to the reduction in the voltage swing applied to each interconnect. However, much of this reduction in power dissipation may be given back in terms of the power required to hold the mid-range supply voltage steady using the voltage regulator 220, both in terms of the power dissipated through the resistors and losses in the op amp as well as losses associated with routing the mid-range supply voltage to each of the repeaters in the links. Thus, there is a need for addressing these issues and/or other issues associated with the prior art.

SUMMARY

A balanced, charge-recycling repeater link is disclosed. The link includes a first set of segments operating in a first voltage domain and a second set of segments operating in a second voltage domain. The link is configured to transmit a first signal over at least one segment in the first set of segments and at least one other segment in the second set of segments. Each segment of the link includes at least one active circuit element configured to charge or discharge one or more corresponding interconnects within the link and a level shifter configured to shift the level of a signal on a last interconnect of the segment from the first voltage domain to the second voltage domain or the second voltage domain to the first voltage domain.

DETAILED DESCRIPTION

Figure 1:
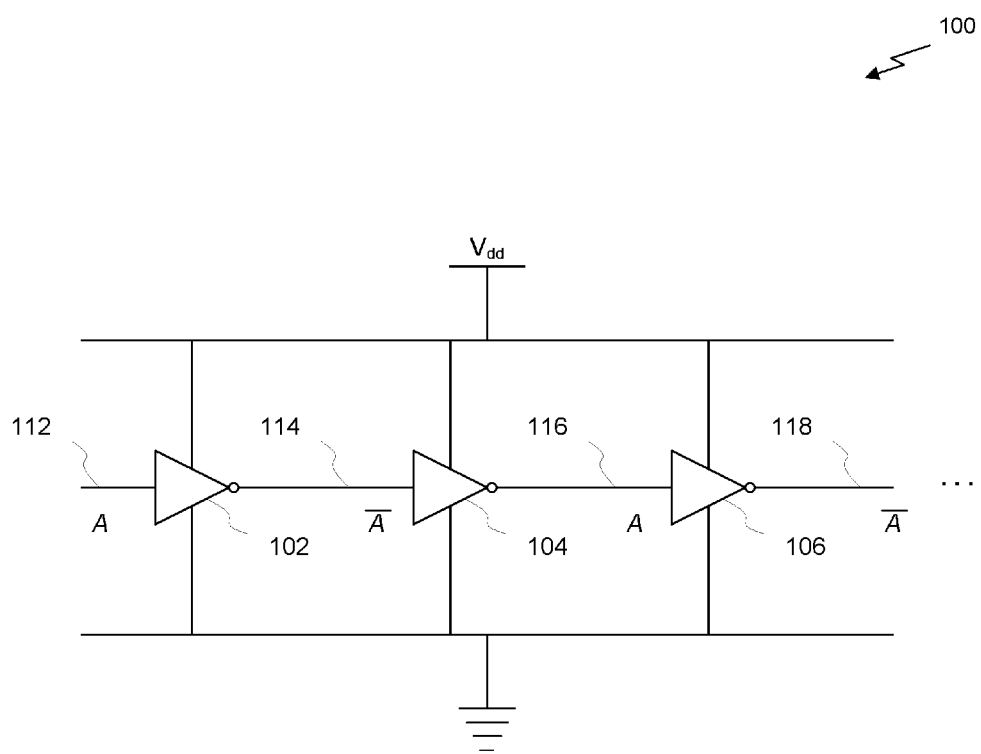
FIG. 1 illustrates a conventional CMOS repeater link, in accordance with the prior art.
Figure 2:
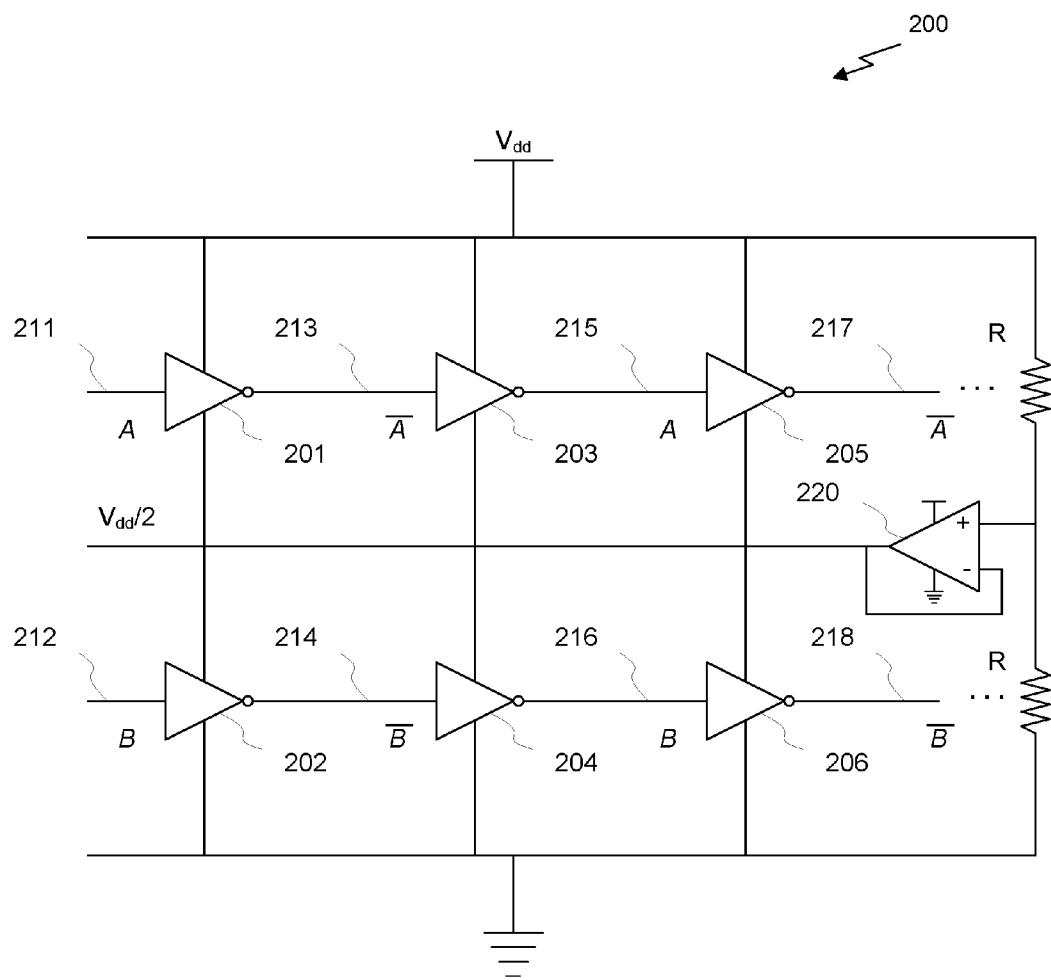
FIG. 2 illustrates a pair of stacked CMOS repeater links, in accordance with the prior art.
Figure 3:
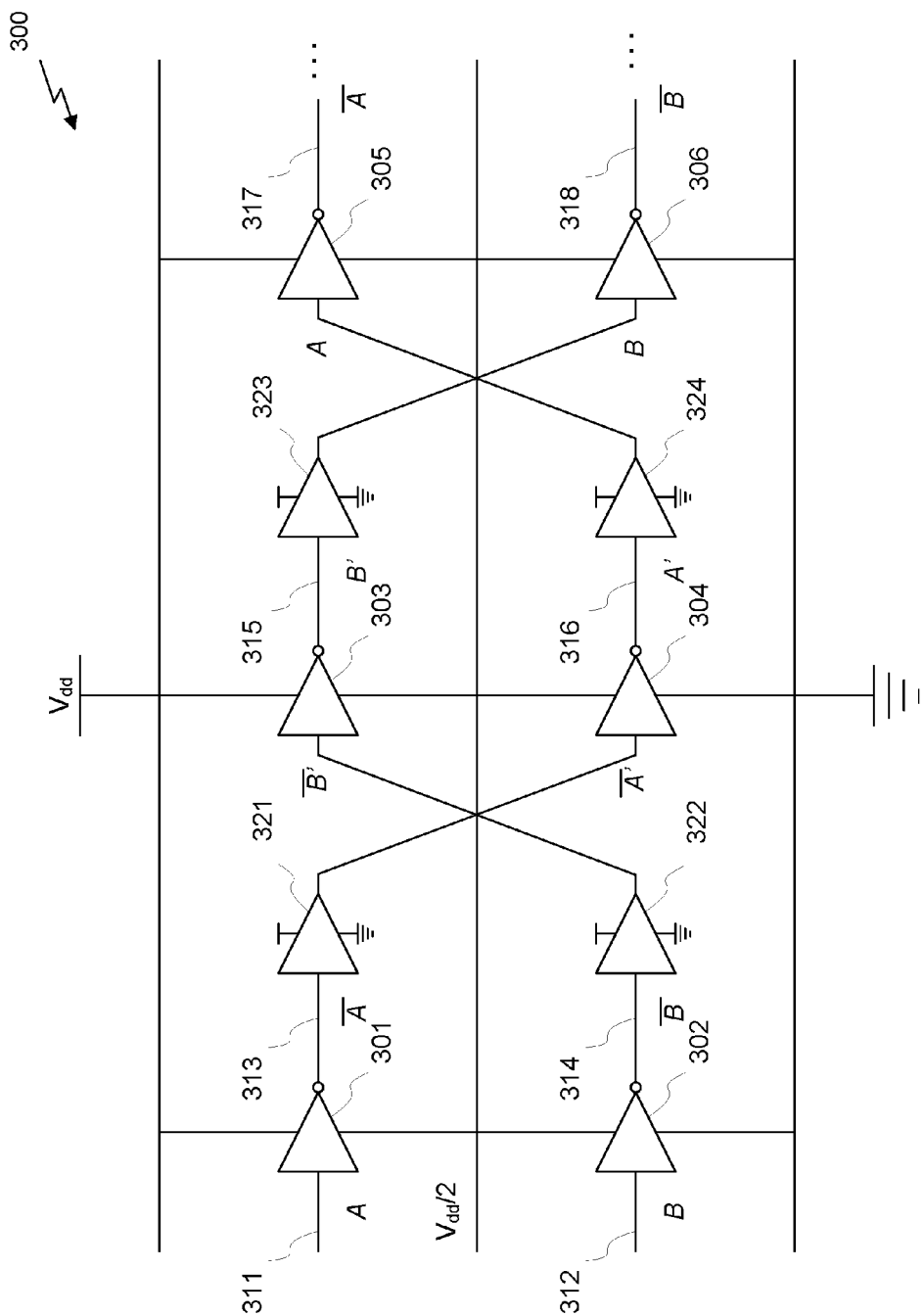
FIG. 3 illustrates a balanced, charge-recycling repeater link, in accordance with one embodiment.

FIG. 3 illustrates a balanced, charge-recycling repeater link 300, in accordance with one embodiment. The link 300 is divided into a plurality of segments, where each segment includes one or more active circuit elements associated with one or more corresponding interconnects. Each segment also includes a level shifter coupled to the last interconnect of the segment. The link 300 is configured to transmit a first signal over at least one segment in a first set of segments operating in a first voltage domain and at least one segment in a second set of segments operating in a second voltage domain. In addition and in parallel with transmitting the first signal, the link 300 is configured to transmit a second signal over at least one additional segment in the second set of segments operating in the second voltage domain and at least one additional segment in the first set of segments operating in the first voltage domain As shown in FIG. 3, the link 300 may be used to transmit a pair of signals (A/B) over an integrated circuit from one set of logic to another set of logic similar to the link 200. However, in contrast to the link 200, the signals (A/B) are transmitted utilizing both voltage domains for each signal rather than isolating a particular signal to a single voltage domain. As shown in FIG. 3, the link 300 includes a plurality of interconnects (e.g., 311, 312, 313, 314, 315, 316, 317, 318, etc.) connected to a number of active circuit elements (e.g., 301, 302, 303, 304, 305, 306, etc.). The active circuit elements are configured to charge and discharge corresponding interconnects based on an input signal coupled to the active circuit element.

The link 300 also includes a plurality of level shifters (e.g., 321, 322, 323, 324, etc.) configured to shift the level of a signal from one domain to the other domain throughout the link 300. In one embodiment, the active circuit elements shown in FIG. 3 may be conventional CMOS inverters; however, in other embodiments, other types of active circuit elements may be implemented within the link 300. It will be appreciated that an even number of inverters may be used to ensure the signals at the end of the link 300 are in the same logic state as the signals at the beginning of the link 300.

As shown in FIG. 3, the link 300 operates in a first voltage domain characterized by a high logic state represented by a high supply voltage ($V_{dd}$) and a low logic state represented by a mid-range supply voltage $$\left(\frac{V_{dd}}{2}\right)$$

and a second voltage domain characterized by a high logic state represented by a mid-range supply voltage $$\left(\frac{V_{dd}}{2}\right)$$

and a low logic state represented by a low supply voltage ($V_{ss}$); i.e., a common ground potential for the integrated circuit. In some embodiments, the low supply voltage may be different than a ground potential. In such embodiments, the mid-range supply voltage may be a potential halfway between the high supply voltage and the low supply voltage; e.g., the mid-range supply voltage may be given as:

$$\frac{V_{dd} - V_{ss}}{2} + V_{ss}.$$

A first signal A may be initially transmitted on the link 300 in the first voltage domain and a second signal B may be initially transmitted on the link 300 in the second voltage domain. For example, as shown in FIG. 3, the interconnect 311 may be charged to logic high state in the first voltage domain ($V_{dd}$) to match a logic high state of signal A. The interconnect 311 is connected to a first segment of the link 300 operating in the first voltage domain that includes inverter 301, interconnect 313, and level shifter 321. The inverter 301 then discharges interconnect 313 to a logic low state in the first voltage domain $$\left(\frac{V_{dd}}{2}\right)$$

to match an inverted state of signal A, i.e., a logic low state of signal $\overline{A}$. The signal $\overline{A}$ is then transmitted over the interconnect 313 to the level shifter 321, where the signal $\overline{A}$ is shifted from the first voltage domain to the second voltage domain (i.e., a logic high state in the first voltage domain ($V_{dd}$) is shifted to a logic high state in the second voltage domain $$\left(\frac{V_{dd}}{2}\right),$$

or a logic low state in the first voltage domain $$\left(\frac{V_{dd}}{2}\right)$$

is shifted to a logic low state in the second voltage domain ($V_{ss}$), etc.).

The shifted signal $\overline{A}$' is coupled to a second segment of the link 300 operating in the second voltage domain that includes the inverter 304, the interconnect 316, and the level shifter 324. The input of the inverter 304, which charges interconnect 316 to a logic high state in the second voltage domain $$\left(\frac{V_{dd}}{2}\right)$$

to match a logic state of signal A. The shifted signal A' is transmitted over the interconnect 316 to the level shifter 324, where the shifted signal A' is shifted from the second voltage domain to the first voltage domain (i.e., a logic high state in the second voltage domain $$\left(\frac{V_{dd}}{2}\right)$$

is shifted to a logic high state in the first voltage domain ($V_{dd}$), or a logic low state in the second voltage domain ($V_{ss}$) is shifted to a logic low state in the first voltage domain $$\left(\frac{V_{dd}}{2}\right),$$

etc.). Shifting the shifted signal A' from the second voltage domain back to the first voltage domain couples the logic state of signal A at the beginning of the link 300 to the input of the inverter 305 included in the third segment of the link 300 operating in the first voltage domain.

Similarly, the interconnect 312 may be charged to logic high state in the second voltage domain $$\left(\frac{V_{dd}}{2}\right)$$

to match a logic high state of signal B. The interconnect 312 is connected to a first segment of the link 300 operating in the second voltage domain that includes inverter 302, interconnect 314, and level shifter 322. The inverter 302 then discharges interconnect 314 to a logic low state in the second voltage domain ($V_{ss}$) to match an inverted state of signal B, i.e., a logic low state of signal $\overline{B}$. The signal $\overline{B}$ is then transmitted over the interconnect 314 to the level shifter 322, where the signal B is shifted from the second voltage domain to the first voltage domain. The shifted signal $\overline{B}$' is coupled to the input of the inverter 303 included in a second segment of the link 300 operating in the first voltage domain, which charges interconnect 315 to a logic high state in the first voltage domain ($V_{dd}$) to match a state of signal B, i.e., a logic high state of the shifted signal B'. The shifted signal B' is transmitted over the interconnect 315 to the level shifter 323, where the shifted signal B' is shifted from the first voltage domain to the second voltage domain. Shifting the shifted signal B' from the first voltage domain back to the second voltage domain couples the logic state of signal B at the beginning of the link 300 to the input of the inverter 306 included in the third segment of the link 300 operating in the second voltage domain.

It will be appreciated that the description provided for signals A/B represents an operation of the signals when both signals are in a logic high state. However, if signals A/B are in a logic low state, the link 300 operates as follows. The interconnect 311 may be charged to a logic low state in the first voltage domain $$\left(\frac{V_{dd}}{2}\right)$$

to match a logic low state of signal A. The inverter 301 then charges interconnect 313 to a logic high state in the first voltage domain ($V_{dd}$) to match an inverted state of signal A, i.e., a logic high state of signal $\overline{A}$. The signal $\overline{A}$ is then transmitted over the interconnect 313 to the level shifter 321, where the signal $\overline{A}$ is shifted from the first voltage domain to the second voltage domain. The shifted signal $\overline{A}'$ is coupled to the input of the inverter 304, which discharges interconnect 316 to a logic low state in the second voltage domain ($V_{ss}$) to match a state of signal A, i.e., a logic low state of the shifted signal A'. The shifted signal A' is transmitted over the interconnect 316 to the level shifter 324, where the shifted signal A' is shifted from the second voltage domain to the first voltage domain.

Similarly, the interconnect 312 may be discharged to a logic low state in the second voltage domain ($V_{ss}$) to match a logic low state of signal B. The inverter 302 then charges interconnect 314 to a logic high state in the second voltage domain $$\left(\frac{V_{dd}}{2}\right)$$

to match an inverted state of signal B, i.e., a logic high state of signal $\overline{B}$. The signal $\overline{B}$ is then transmitted over the interconnect 314 to the level shifter 322, where the signal $\overline{B}$ is shifted from the second voltage domain to the first voltage domain. The shifted signal $\overline{B}'$ is coupled to the input of the inverter 303, which discharges interconnect 315 to a logic low state in the first voltage domain $$\left(\frac{V_{dd}}{2}\right)$$

to match a state of signal B, i.e., a logic low state of the shifted signal B'. The shifted signal B' is transmitted over the interconnect 315 to the level shifter 323, where the shifted signal B' is shifted from the first voltage domain to the second voltage domain.

It will be appreciated that the link 300 does not require a voltage regulator to maintain a stable mid-range supply voltage, unlike the link 200. The mid-range supply voltage remains stable because for any transition of signal A, the charging or discharging of interconnect 313 in the first voltage domain will be balanced by the charging or discharging of interconnect 316 in the second voltage domain. In other words, when the logic state of signal A transitions from logic low to logic high, the inverter 301 discharges interconnect 313 to a low potential in the first voltage domain $$\left(\frac{V_{dd}}{2}\right)$$

from a high potential in the first voltage domain ($V_{dd}$) and the inverter 304 charges interconnect 316 to a high potential in the second voltage domain $$\left(\frac{V_{dd}}{2}\right)$$

from a low potential in the second voltage domain ($V_{ss}$). As long as the differences between the high potential and low potential in both the first voltage domain and the second voltage domain are equal (e.g., the mid-range supply voltage is halfway between the high supply voltage and the low supply voltage, etc.) and the electrical characteristics of the interconnects are equal (e.g., the RC value associated with the corresponding interconnects is equal, etc.), then the charge pulled from the mid-range supply voltage by one of the inverters will be equal to the charge drained to the mid-range supply voltage by the corresponding inverter. When the logic state of signal A transitions from logic high to logic low, the inverter 301 charges interconnect 313 to a high potential in the first voltage domain ($V_{dd}$) from a low potential in the first voltage domain $$\left(\frac{V_{dd}}{2}\right)$$

and the inverter 304 discharges interconnect 316 to a low potential in the second voltage domain ($V_{ss}$) from a high potential in the second voltage domain $$\left(\frac{V_{dd}}{2}\right).$$

It will be appreciated that charging interconnect 313 to a high potential in the first voltage domain ($V_{dd}$) will pull charge from the high supply voltage ($V_{dd}$) and discharging interconnect 316 to a low potential in the second voltage domain ($V_{ss}$) will drain charge to the low supply voltage ($V_{ss}$), which are maintained by the main voltage regulator for the integrated circuit (i.e., the high supply voltage and low supply voltage are stable).

Similarly, when the logic state of signal B transitions from logic low to logic high, the inverter 302 discharges interconnect 314 to a low potential in the second voltage domain ($V_{ss}$) from a high potential in the second voltage domain $$\left(\frac{V_{dd}}{2}\right)$$

and the inverter 303 charges interconnect 315 to a high potential in the first voltage domain ($V_{dd}$) from a low potential in the first voltage domain $$\left(\frac{V_{dd}}{2}\right).$$

When the logic state of signal B transitions from logic high to logic low, the inverter 302 charges interconnect 314 to a high potential in the second voltage domain $\left(\frac{V_{dd}}{2}\right)$ from a low potential in the second voltage domain ($V_{ss}$) and the inverter 303 discharges interconnect 315 to a low potential in the first voltage domain $\left(\frac{V_{dd}}{2}\right)$ from a high potential in the first voltage domain ($V_{dd}$). It will be appreciated that discharging interconnect 314 to a low potential in the second voltage domain ($V_{ss}$) will drain charge to the low supply voltage ($V_{ss}$) and charging interconnect 315 to a high potential in the first voltage domain ($V_{dd}$) will drain charge from the high supply voltage ($V_{dd}$), which are maintained by the main voltage regulator for the integrated circuit (i.e., the high supply voltage and low supply voltage are stable).

It will be appreciated that even when the signals A/B transition independently, the mid-range supply voltage remains stable because the signals are shifted to both voltage domains such that inverters associated with a particular signal recycle charge from inverters corresponding to the same signal.

Although not shown explicitly, additional segments may be added to the link 300 to extend the range over which the signal is transmitted or to reduce a length of each corresponding interconnect to thereby reduce a time delay associated with transmitting the signal(s) over the link 300.

Figure 4:
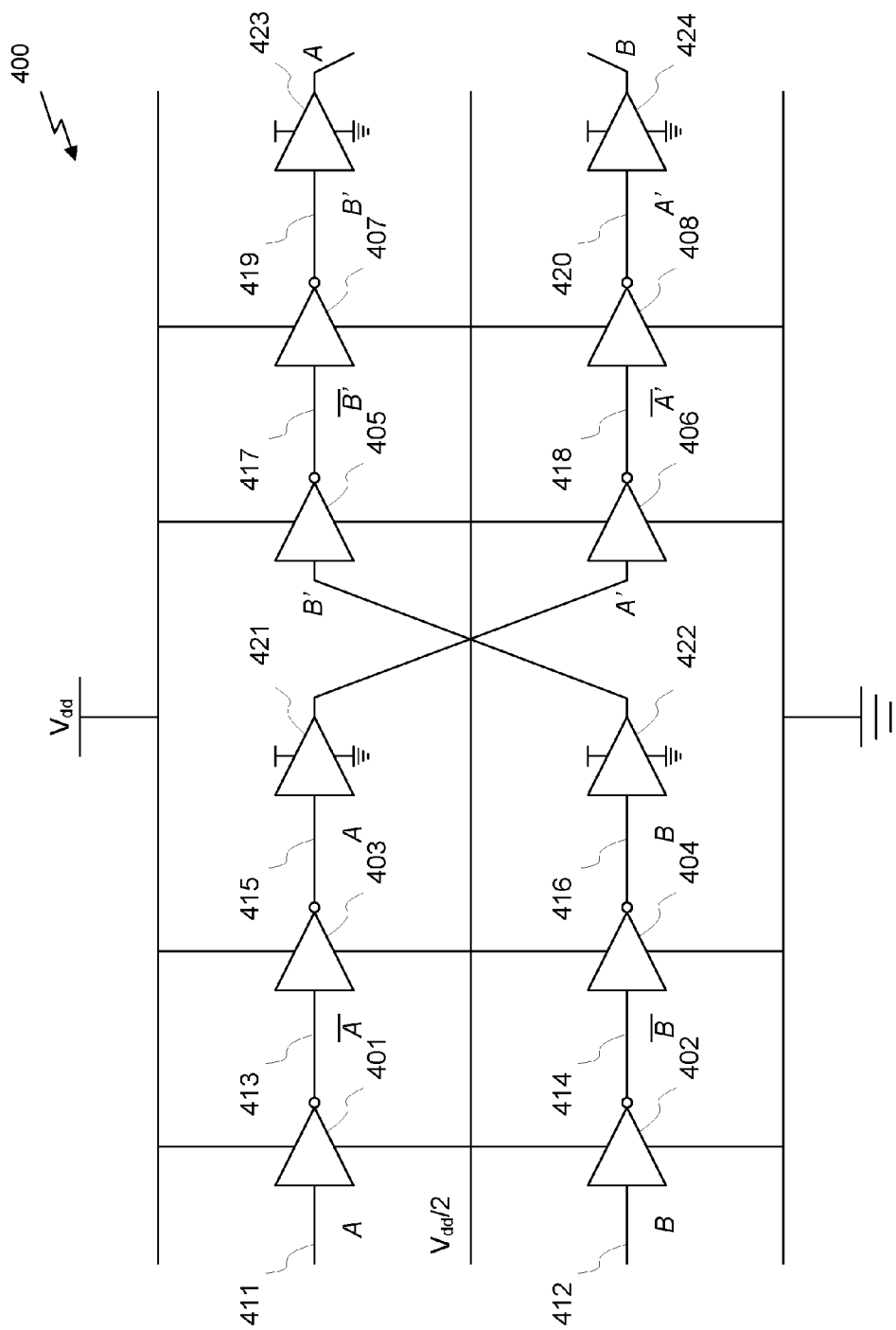
FIG. 4 illustrates a balanced, charge-recycling repeater link, in accordance with another embodiment.

FIG. 4 illustrates a balanced, charge-recycling repeater link 400, in accordance with another embodiment. The link 400 is similar to the link 300 except that each segment of the link 400 includes a plurality of active circuit elements and a plurality of corresponding interconnects. For example, as shown in FIG. 4, each segment of the link 400 includes two inverters and two interconnects. An interconnect 411 is charged/discharged to the logic state for a signal A that is coupled to the first segment of the link 400 operating in a first voltage domain that includes the inverters 401 and 403, interconnects 413 and 415, and the level shifter 421. The inverter 401 inverts the signal A to generate the inverted signal $\overline{A}$, which is transmitted to the inverter 403 via the interconnect 413. The inverter 403 inverts the inverted signal $\overline{A}$ to generate the signal A on interconnect 415. The signal A in the first domain is then shifted to the second voltage domain by the level shifter 421 and transmitted as signal A' to a second segment of the link 400 operating in the second voltage domain that includes the inverters 406 and 408, interconnects 418 and 420, and the level shifter 424. Inverter 406 inverts the signal A' to generate the inverted signal $\overline{A}$' on interconnect 418, and inverter 408 inverts the inverted signal $\overline{A}$' to generate the signal A' on interconnect 420. The signal A' is then shifted back to the first voltage domain by the level shifter 424. A first segment of the link 400 operating in the second voltage domain that includes inverters 402 and 404, interconnects 412 and 414, and level shifter 422 as well as a second segment of the link 400 operating in the first voltage domain that includes inverters 405 and 407, interconnects 417 and 419, and level shifter 423 operate on signal B in a similar fashion to how the first segment of the link 400 operating in the first voltage domain and the second segment of the link 400 operating in the second voltage domain operate on signal A.

It will be appreciated that, in alternate embodiments, more than two active circuit elements and more than two corresponding interconnects may be included in each segment of the link 400. As long as the number of active circuit elements/interconnects in a first voltage domain matches a corresponding number of active circuit elements/interconnects in a second voltage domain, and the capacitance in the interconnects in the first and second voltage domains match, the charge recycling will be balanced and the mid-range supply voltage will be stable.

Figure 5:
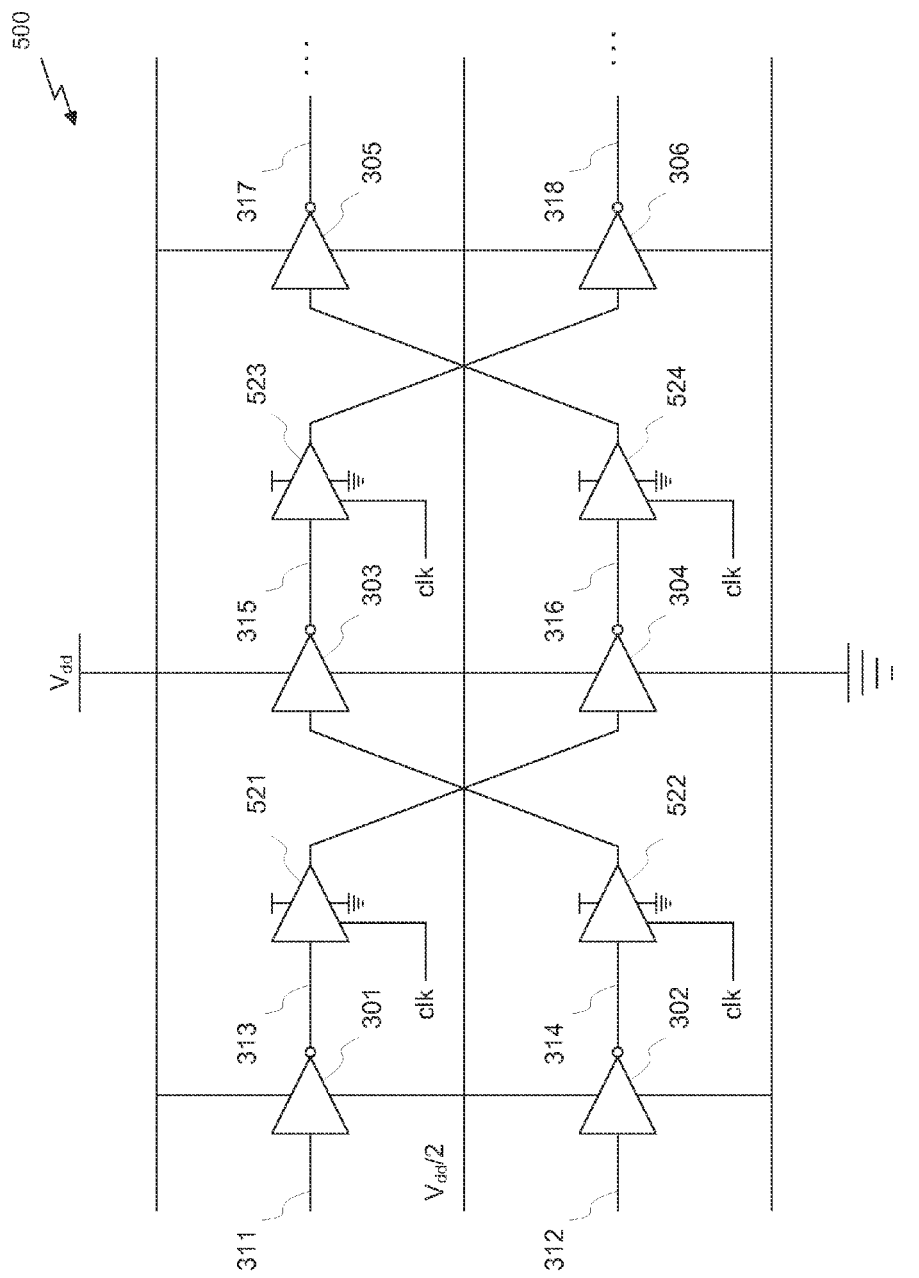
FIG. 5 illustrates a balanced, charge-recycling repeater link that implements re-timing, in accordance with one embodiment.

FIG. 5 illustrates a balanced, charge-recycling repeater link 500 that implements re-timing, in accordance with one embodiment. As shown, the link 500 is similar to the link 300 of FIG. 3, except that the level shifters are clocked to synchronize the shifting of signals from one domain to the other domain. In other words, the asynchronous level shifters 321-324 of link 300 have been replaced with synchronous level shifters 521-524 that share a common clock signal. The clock signal may be the same clock signal as the data clock for the signals A/B. In one embodiment, the signals A/B are configured to transition on the rising edge of the clock signal and the level shifters are configured to shift the signals A/B to the other voltage domain on the falling edge of the clock signal. By utilizing synchronized level shifters in this manner, the inverters are allowed to charge or discharge the interconnects in a particular segment of the link 500 before the signal is shifted to the other voltage domain based on the synchronized transitions of the clock signal. In yet another embodiment, the link 400 of FIG. 4 may implement re-timing by replacing the level shifters 421-424 with clocked level shifters 521-524.

It will be appreciated that by synchronizing the level shifters in this manner, the signal will effectively be pipelined within the plurality of segments in the link 500. For example, the initial signals A/B will be propagated through the link 500 up to the level shifters at the end of the first segments of the link 500 operating in each voltage domain. However, the initial logic state of the signals will not be propagated to the second segments of the link 500 operating in each voltage domain until the falling edge of the clock signal. After the falling edge of the clock signal, the initial logic state of the signals A/B will be propagated through the link 500 to the second segments of the link 500 operating in each voltage domain. However, the initial signals A/B will not be shifted back to their original voltage domains at the end of the second segments of the link 500 operating in each voltage domain until the next falling edge of the clock signal. Therefore, it takes a full clock period per segment of the link 500 operating in a particular voltage domain to propagate the signal from the beginning of the link 500 to the end of the link 500. However, a faster data clock may be utilized with links that implement re-timing because the signal at the beginning of the link can be transitioned after the signal has propagated to the next segment of the link rather than requiring the state of the signal to be maintained at the beginning of the link until the signal has propagated to the end of the link 500.

Figure 6:
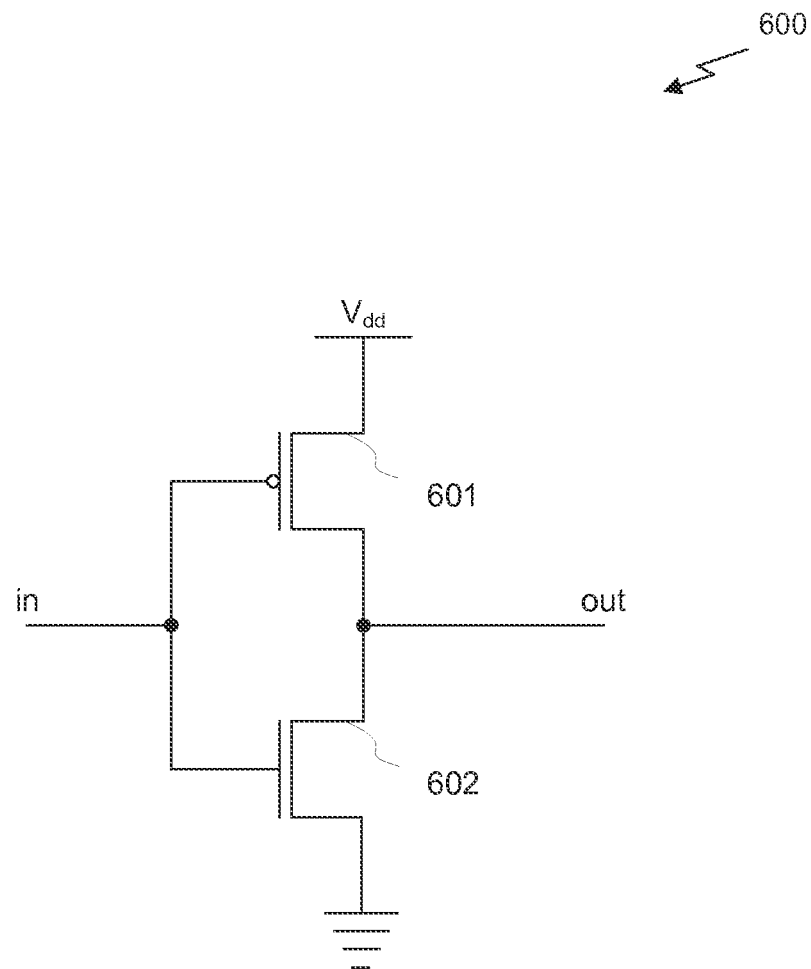
FIG. 6 illustrates a conventional CMOS inverter, in accordance with the prior art.

FIG. 6 illustrates a conventional CMOS inverter 600, in accordance with the prior art. The inverter 600 includes a PMOS (p-type metal oxide semiconductor) transistor 601 and an NMOS (n-type metal oxide semiconductor) transistor 602. The inverters 301-306 and/or 401-408 may be implemented using the inverter 600 shown in FIG. 6. In other embodiments, the inverters 301-306 and/or 401-406 may be implemented with other types of inverters different from the conventional CMOS inverter 600 shown in FIG. 6. In yet other embodiments, the active circuit elements of links 300, 400, or 500 may not be inverters at all.

Figure 7A:
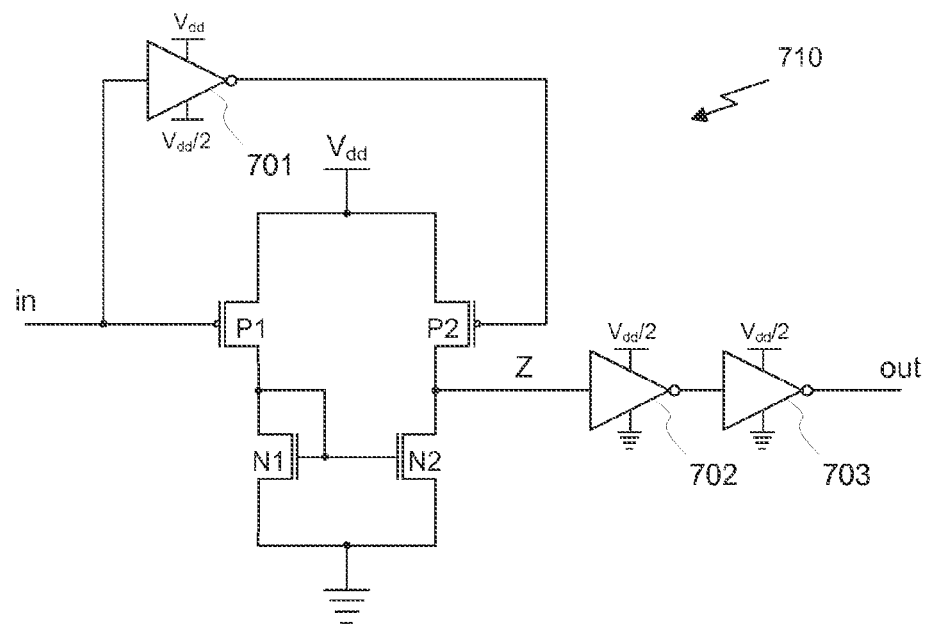
FIGS. 7A and 7B illustrate current-mirror level shifters for shifting signals between the first voltage domain and the second voltage domain, in accordance with one embodiment.
Figure 7B:
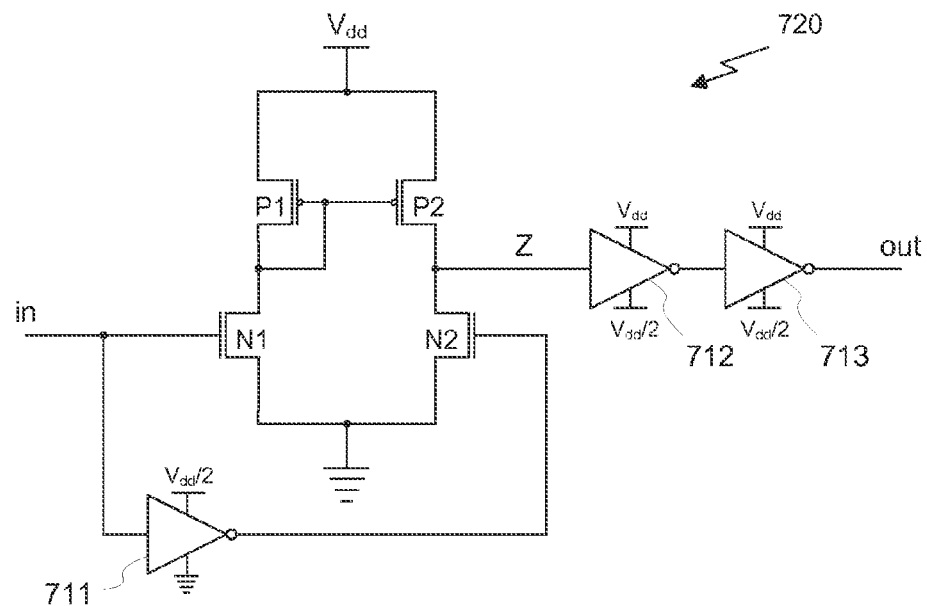

FIGS. 7A and 7B illustrate current-mirror level shifters 710 and 720 for shifting signals between the first voltage domain and the second voltage domain, in accordance with one embodiment. The first voltage domain corresponds to a high supply voltage and a common mid-range supply voltage, and the second voltage domain corresponds to a low supply voltage and the common mid-range supply voltage.

The level shifter 710 receives an input signal in a first voltage domain and shifts the level of the input signal to a second voltage domain. As shown in FIG. 7A, the input signal is coupled to a first PMOS transistor, P1, and a first inverter 701 supplied by the first voltage domain (i.e., the same voltage domain as the input signal), which provides an inverted version of the input signal in the first voltage domain to a second PMOS transistor, P2. The PMOS transistors P1 and P2 have a source terminal coupled to a high supply voltage ($V_{dd}$). The input signal is coupled to a gate of the first PMOS transistor P1 and the inverted version of the input signal is coupled to a gate of the second PMOS transistor P2. When the input signal is in a high logic state in the first voltage domain then the first PMOS transistor P1 is disabled and the second PMOS transistor P2 is enabled. When the input signal is in a low logic state in the first voltage domain then the first PMOS transistor P1 is enabled and the second PMOS transistor P2 is disabled. A first NMOS transistor N has a gate coupled to the drain of the first PMOS transistor P1 and a gate of a second NMOS transistor N2. The NMOS transistors N1 and N2 have a source terminal coupled to a low supply voltage ($V_{ss}$).

A common node, coupled to the drain of the second PMOS transistor P2 and the drain of the second NMOS transistor N2, provides an intermediate signal Z in the full voltage domain as the output of a first stage of the level shifter 710. The signal Z has a logic state that matches the logic state of the input signal. In other words, the first stage of the level shifter 710 shifts the input signal from the first voltage domain to the full voltage domain. The intermediate signal Z is coupled to a pair of inverters 702 and 703 supplied by the second voltage domain and configured to shift the intermediate signal Z to the second voltage domain.

The level shifter 720 receives an input signal in the second voltage domain and shifts the level of the input signal to the first voltage domain. As shown in FIG. 7B, the input signal is coupled to a first NMOS transistor, N1, and a first inverter 711 supplied by the second voltage domain (i.e., the same voltage domain as the input signal), which provides an inverted version of the input signal in the second voltage domain to a second NMOS transistor, N2. The NMOS transistors N1 and N2 have a source terminal coupled to a low supply voltage ($V_{ss}$). The input signal is coupled to a gate of the first NMOS transistor N1 and the inverted version of the input signal is coupled to a gate of the second NMOS transistor N2. When the input signal is in a high logic state in the second voltage domain then the first NMOS transistor N1 is enabled and the second NMOS transistor N2 is disabled. When the input signal is in a low logic state in the second voltage domain then the first NMOS transistor N is disabled and the second NMOS transistor N2 is enabled. A first PMOS transistor P1 has a gate coupled to the drain of the first NMOS transistor N1 and a gate of a second PMOS transistor P2. The PMOS transistors P1 and P2 have a source terminal coupled to a high supply voltage ($V_{dd}$).

A common node, coupled to the drain of the second PMOS transistor P2 and the drain of the second NMOS transistor N2, provides an intermediate signal Z in the full voltage domain as the output of a first stage of the level shifter 720. The signal Z has a logic state that matches the logic state of the input signal. In other words, the first stage of the level shifter 720 shifts the input signal from the second voltage domain to the full voltage domain. The intermediate signal Z is coupled to a pair of inverters 712 and 713 supplied by the first voltage domain and configured to shift the intermediate signal Z to the first voltage domain.

The level shifter 710 may be implemented in the link 300 as level shifters 321 and 323 or link 400 as level shifters 421 and 423 to shift the signal from the first voltage domain to the second voltage domain. Similarly, the level shifter 720 may be implemented in the link 300 as level shifters 322 and 324 or link 400 as level shifters 422 and 424 to shift the signal from the second voltage domain to the first voltage domain. However, level shifters 710 and 720 are not ideal for a low-power application because they consume constant current from the power supply when level shifter 710 is supplied with a logic low input signal or when level shifter 720 is supplied with a logic high input signal.

Figure 7C:
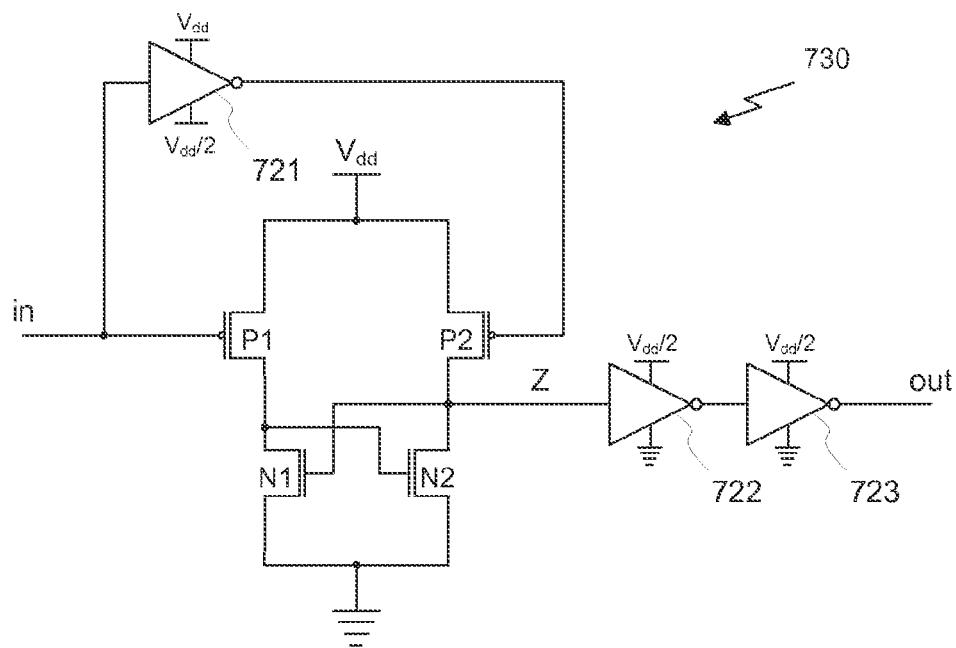
FIGS. 7C and 7D illustrate cross-coupled pair level shifters for shifting signals between the first voltage domain and the second voltage domain, in accordance with another embodiment.
Figure 7D:
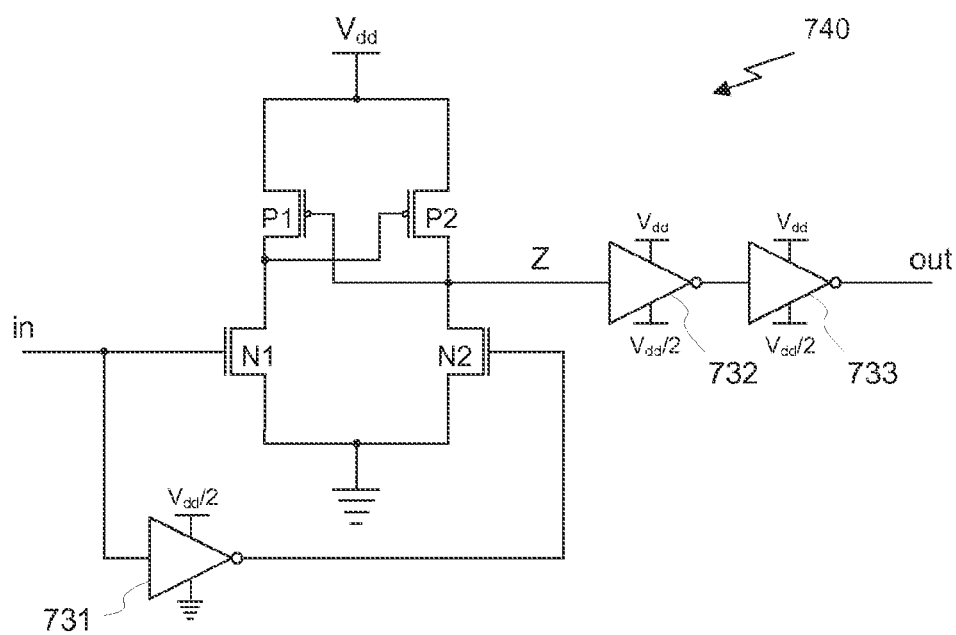

FIGS. 7C and 7D illustrate cross-coupled pair level shifters 720 and 730 for shifting signals between the first voltage domain and the second voltage domain, in accordance with another embodiment. Again, the first voltage domain corresponds to a high supply voltage and a common mid-range supply voltage, and the second voltage domain corresponds to a low supply voltage and the common mid-range supply voltage.

The level shifter 730 receives an input signal in a first voltage domain and shifts the level of the input signal to a second voltage domain. As shown in FIG. 7C, the input signal is coupled to a first PMOS transistor, P1, and a first inverter 721 supplied by the first voltage domain (i.e., the same voltage domain as the input signal), which provides an inverted version of the input signal in the first voltage domain to a second PMOS transistor, P2. The PMOS transistors P1 and P2 have a source terminal coupled to a high supply voltage ($V_{dd}$). The input signal is coupled to a gate of the first PMOS transistor P1 and the inverted version of the input signal is coupled to a gate of the second PMOS transistor P2. When the input signal is in a high logic state in the first voltage domain then the first PMOS transistor P1 is disabled and the second PMOS transistor P2 is enabled. When the input signal is in a low logic state in the first voltage domain then the first PMOS transistor P1 is enabled and the second PMOS transistor P2 is disabled. A first NMOS transistor N1 has a gate coupled to the drain of the second PMOS transistor P2, and a second NMOS transistor N2 has a gate coupled to the drain of the first PMOS transistor P1. The drain of the first NMOS transistor N1 shares a common node with the drain of the first PMOS transistor P1, and the drain of the second NMOS transistor N2 shares a common node with the drain of the second PMOS transistor P2. The NMOS transistors N1 and N2 have a source terminal coupled to a low supply voltage ($V_{ss}$).

A common node, coupled to the drain of the second PMOS transistor P2 and the drain of the second NMOS transistor N2, provides an intermediate signal Z in the full voltage domain as the output of a first stage of the level shifter 730. The signal Z has a logic state that matches the logic state of the input signal. In other words, the first stage of the level shifter 730 shifts the input signal from the first voltage domain to the full voltage domain. The intermediate signal Z is coupled to a pair of inverters 722 and 723 supplied by the second voltage domain and configured to shift the intermediate signal Z to the second voltage domain.

The level shifter 740 receives an input signal in the second voltage domain and shifts the level of the input signal to the first voltage domain. As shown in FIG. 7D, the input signal is coupled to a first NMOS transistor, N1, and a first inverter 731 supplied by the second voltage domain (i.e., the same voltage domain as the input signal), which provides an inverted version of the input signal in the second voltage domain to a second NMOS transistor, N2. The NMOS transistors N1 and N2 have a source terminal coupled to a low supply voltage ($V_{ss}$). The input signal is coupled to a gate of the first NMOS transistor N1 and the inverted version of the input signal is coupled to a gate of the second NMOS transistor N2. When the input signal is in a high logic state in the second voltage domain then the first NMOS transistor N1 is enabled and the second NMOS transistor N2 is disabled. When the input signal is in a low logic state in the second voltage domain then the first NMOS transistor N1 is disabled and the second NMOS transistor N2 is enabled. A first PMOS transistor P1 has a gate coupled to the drain of the second NMOS transistor N2, and a second PMOS transistor P2 has a gate coupled to the drain of the first NMOS transistor N1. The drain of the first PMOS transistor P1 shares a common node with the drain of the first NMOS transistor N1, and the drain of the second PMOS transistor P2 shares a common node with the drain of the second NMOS transistor N2. The PMOS transistors P1 and P2 have a source terminal coupled to a high supply voltage ($V_{dd}$).

A common node, coupled to the drain of the second PMOS transistor P2 and the drain of the second NMOS transistor N2, provides an intermediate signal Z in the full voltage domain as the output of a first stage of the level shifter 740. The signal Z has a logic state that matches the logic state of the input signal. In other words, the first stage of the level shifter 740 shifts the input signal from the second voltage domain to the full voltage domain. The intermediate signal Z is coupled to a pair of inverters 732 and 733 supplied by the first voltage domain and configured to shift the intermediate signal Z to the first voltage domain.

The level shifter 730 may be implemented in the link 300 as level shifters 321 and 323 or link 400 as level shifters 421 and 423 to shift the signal from the first voltage domain to the second voltage domain. Similarly, the level shifter 740 may be implemented in the link 300 as level shifters 322 and 324 or link 400 as level shifters 422 and 424 to shift the signal from the second voltage domain to the first voltage domain. Although cross-coupled pair level shifters 730 and 740 consume less power than current-mirror level shifters 710 and 720, care should be taken to ensure that the relative strengths of the PMOS transistors and the NMOS transistors are approximately equal. If the relative strengths of the PMOS transistors and the NMOS transistors falls outside of a given range, then the level shifters 730 and 740 may fail to work properly.

Figure 7E:
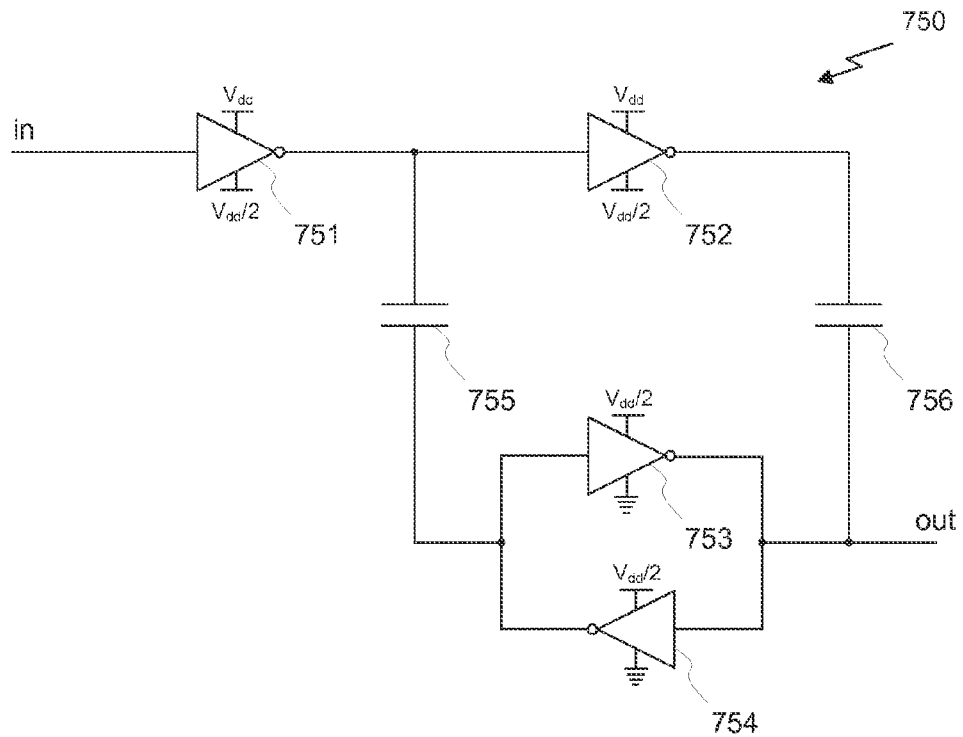
FIGS. 7E and 7F illustrate continuously-timed, capacitively-coupled level shifters and for shifting signals between the first voltage domain and the second voltage domain, in accordance with another embodiment.
Figure 7F:
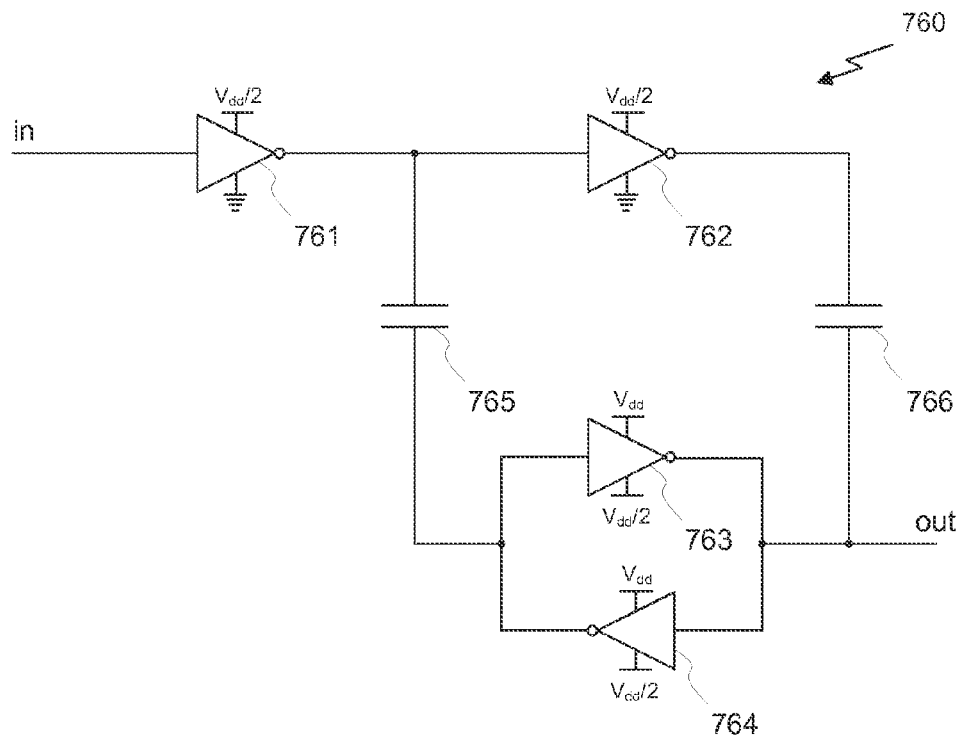

FIGS. 7E and 7F illustrate continuously-timed, capacitively-coupled level shifters 750 and 760 for shifting signals between the first voltage domain and the second voltage domain, in accordance with another embodiment. Again, the first voltage domain corresponds to a high supply voltage and a common mid-range supply voltage, and the second voltage domain corresponds to a low supply voltage and the common mid-range supply voltage.

As shown in FIG. 7E, the level shifter 750 receives an input signal in a first voltage domain and shifts the level of the input signal to a second voltage domain. The input signal is coupled to a first inverter 751 supplied by the first voltage domain (i.e., the same voltage domain as the input signal), which provides an inverted version of the input signal in the first voltage domain to a second inverter 752 supplied by the first voltage domain. The inverters 751 and 752 decouple the input signal from a pair of capacitors 755 and 756. The capacitors 755 and 756 are coupled to a memory cell formed by a pair of inverters 753 and 754 supplied by the second voltage domain. The charge across the capacitors causes the state of the memory cell to change in response to a transition in the input signal such that a logic level of the output signal in the second voltage domain matches a logic level of the input signal in the first voltage domain. For example, when the input signal is logic high ($V_{dd}$), then the output signal is also logic high ($V_{dd}/2$), but when the input signal is logic low ($V_{dd}/2$), then the output signal is also logic low ($V_{ss}$).

As shown in FIG. 7F, the level shifter 760 receives an input signal in a second voltage domain and shifts the level of the input signal to a first voltage domain. The input signal is coupled to a first inverter 761 supplied by the second voltage domain (i.e., the same voltage domain as the input signal), which provides an inverted version of the input signal in the second voltage domain to a second inverter 762 supplied by the second voltage domain. The inverters 761 and 762 decouple the input signal from a pair of capacitors 765 and 766. The capacitors 765 and 766 are coupled to a memory cell formed by a pair of inverters 763 and 764 supplied by the first voltage domain. Again, the charge across the capacitors causes the state of the memory cell to change in response to a transition in the input signal such that a logic level of the output signal in the first voltage domain matches a logic level of the input signal in the second voltage domain. For example, when the input signal is logic high ($V_{dd}/2$), then the output signal is also logic high ($V_{dd}$), but when the input signal is logic low ($V_{ss}$), then the output signal is also logic low ($V_{dd}/2$).

The level shifter 750 may be implemented in the link 300 as level shifters 321 and 323 or link 400 as level shifters 421 and 423 to shift the signal from the first voltage domain to the second voltage domain. Similarly, the level shifter 760 may be implemented in the link 300 as level shifters 322 and 324 or link 400 as level shifters 422 and 424 to shift the signal from the second voltage domain to the first voltage domain.

It will be appreciated that other configurations of level shifters are contemplated as being within the scope of the present disclosure and nothing should be construed as limiting the level shifters included in link 300 or link 400 to only implementations of the level shifters shown in FIGS. 7A though 7F.

Each of the level shifters shown in FIGS. 7A through 7F performs the necessary job of shifting signals between the voltage domains. However, as set forth above, each of the solutions introduces a separate issue. In the case of level shifters 710 and 720, the level shifters may consume too much power, thereby sacrificing some of the power savings associated with using a charge-recycling repeater link. In the case of level shifters 730 and 740, the level shifters may need to be designed in such a precise manner to ensure that the relative strengths of the PMOS and NMOS transistors are approximately the same. In the case of level shifters 750 and 760, the time to charge and discharge the capacitors in order to change the state of the memory cell may limit the speed of the link. One solution to these issues may be to use a clocked comparator instead of a conventional level shifter design in order to shift the level of the signals between the two voltage domains.

Figures 8A through 8D illustrate clocked level shifters 850 & 860 for shifting signals between the first voltage domain and the second voltage domain, in accordance with one embodiment. The clocked level shifters 850 & 860 implements re-timing of the signal based on a differential clock signal, clkP/clkN, which may be generated by passing a clock signal, clkP, through an inverter to generate an inverted version of the clock signal, clkN.

Figure 8A:
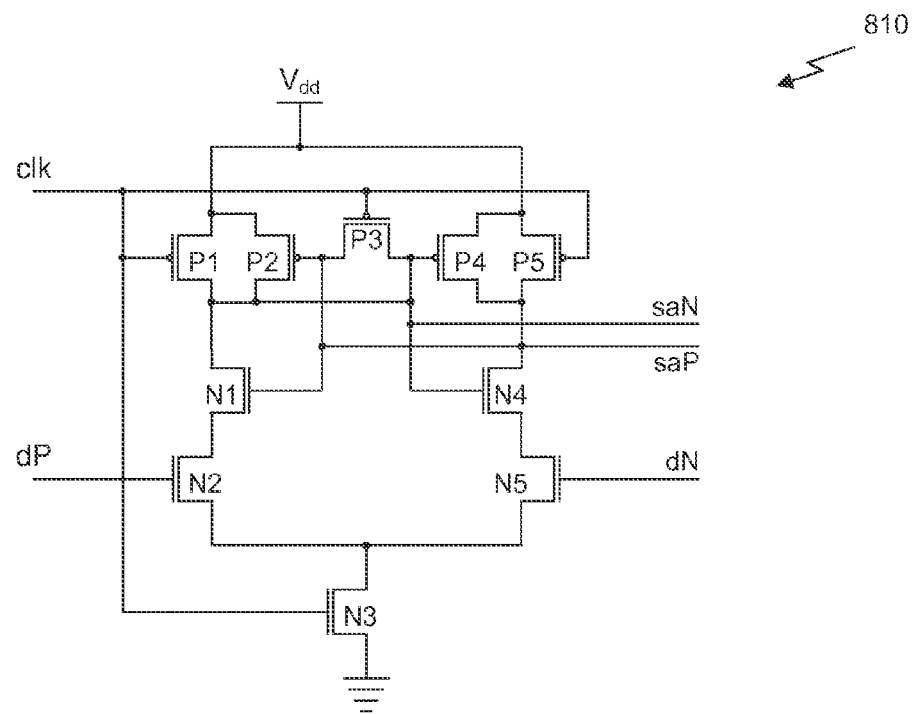
FIGS. 8A through 8D illustrate clocked level shifters for shifting signals between the first voltage domain and the second voltage domain, in accordance with one embodiment.
Figure 8B:
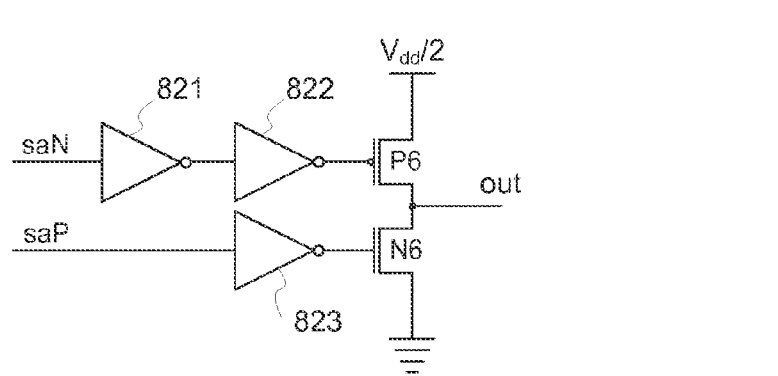

As shown in FIG. 8A, a sense amplifier circuit 810 receives a differential input, dP/dN, and a clock signal, clk, and generates output signals, saN/saP. The sense amplifier circuit 810 is divided into two portions, an NMOS differential amplifier comprising three NMOS transistors (N2, N3, and N5) and a cross-coupled pair of inverters comprising two NMOS transistors (N1 and N4) and two PMOS transistors (P2 and P4). The sense amplifier circuit 810 also includes three PMOS transistors (P1, P3, and P5) used to pre-charge the differential sense amplifier output signals to a high supply voltage ($V_{dd}$).

The sense amplifier circuit 810 has two phases of operation. In a first phase, the clock signal, clk, is low and PMOS transistors P1, P3, and P5 are enabled, which causes the output signals saN and saP to be charged to a high supply voltage ($V_{dd}$). During the first phase, the NMOS differential amplifier current is zero because NMOS transistor N3 is disabled, which allows the common node between NMOS transistors N1 and N2 as well as the common node between NMOS transistors N4 and N5 to be pulled up to a voltage near the high supply voltage (e.g., $V_{dd}-V_{tn}$, where $V_{tn}$ is the threshold voltage for the NMOS transistor). In a second phase, the clock signal, elk, is high and PMOS transistors P1, P3, and P5 are disabled, which allows the output signals to float. The NMOS transistor N3 is enabled and the NMOS differential amplifier pulls current through the differential pair (NMOS transistors N2 and N5), and the difference in current through the enabled/disabled NMOS transistors forms a voltage difference to appear on the output signals saN and saP. Once enough current has been pulled through the NMOS differential amplifier and the voltage difference between the output signals exceeds a threshold voltage, the cross-coupled pair of inverters rapidly drive the output signals towards the supply rails (e.g., $V_{dd}$ and $V_{ss}$).

In other words, the sense amplifier circuit 810 causes both output signals to be driven high when the clock signal is low, and the sense amplifier circuit 810 causes one of the output signals (i.e., either signal saN or signal saP) to be driven low when the clock signal is high while the other output signal is driven high. In effect, one of the output signals pulses low during each clock cycle depending on the polarity of the differential input signal. For example, if dP is high and dN is low, then saN is pulsed low while saP remains high, and if dN is high and dP is low, then saP is pulsed low while saN remains high.

The pulsed output signals of the sense amplifier circuit 810 can be used to flip a slave circuit 820 to resolve the pulsed output signals into a uni-polar output. As shown in Figure SB, the slave circuit 820 receives the pulsed output signals saN and saP and passes one of the differential outputs (e.g., saN) through an inverter 821 such that the differential pulsed output signals saN and saP are either both driven high or both driven low. The output signals are also passed through a pair of inverters 822 and 823 to avoid coupling the Miller capacitance of the slave circuit 820 back to the sense amplifier circuit 810. The output signals are then coupled to an inverter (e.g., PMOS transistor P6 and NMOS transistor N6) supplied by the second voltage domain. A common node of the inverter provides the output signal in the second voltage domain.

During operation, when the clock signal is low, saN and saP are pre-charged high and the output signal is floating (both transistor P6 and transistor N6 are disabled). When the clock signal is high, either output signal saN is high and output signal saP is low, such that transistor P6 is disabled and transistor N6 is enabled, driving the output signal to a low supply voltage ($V_{ss}$), or output signal saN is low and output signal saP is high, such that transistor P6 is enabled and transistor N6 is disabled, driving the output signal to a mid-range supply voltage ($V_{dd}/2$).

Figure 8C:
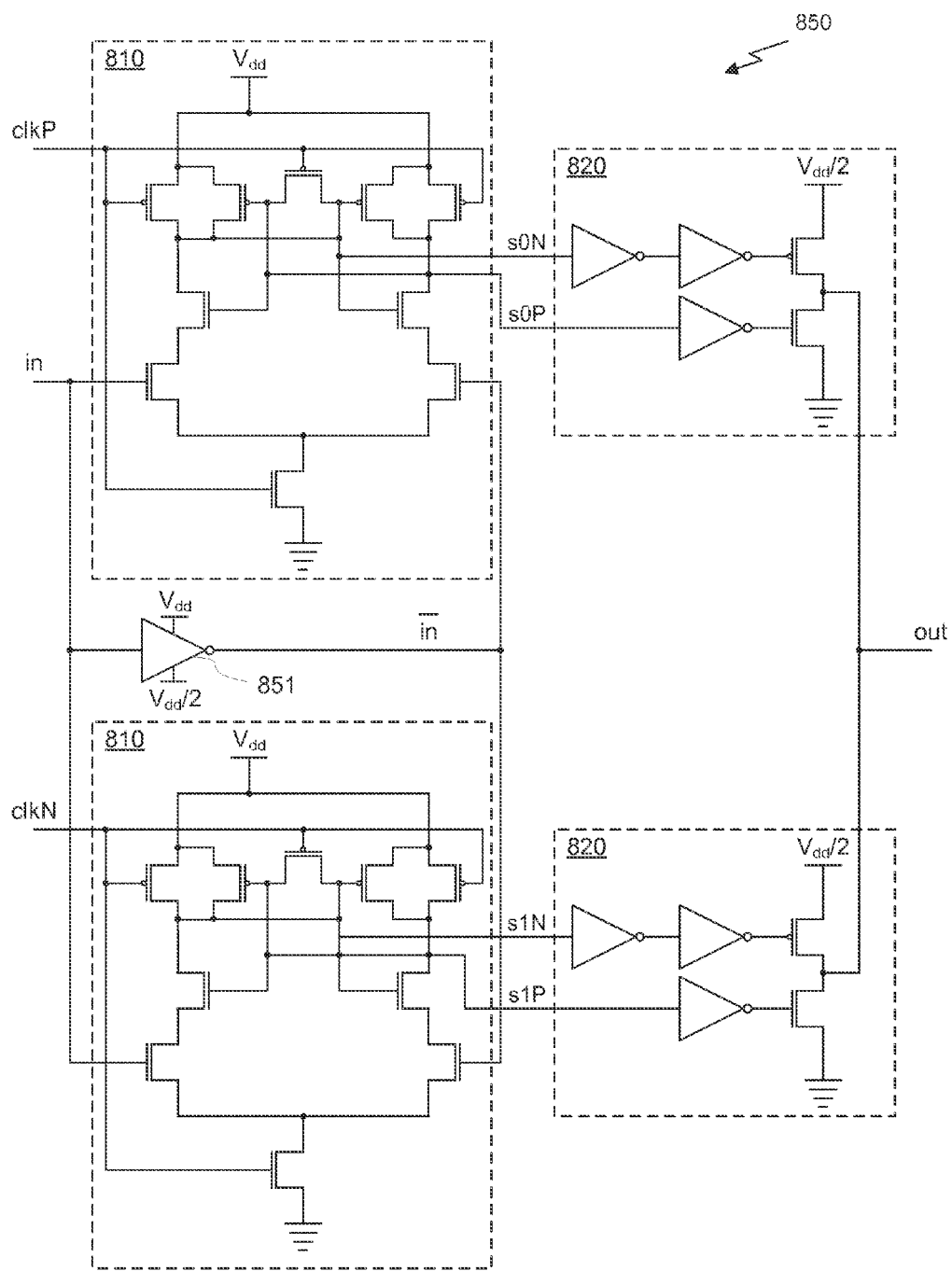

As shown in FIG. 8C, the sense amplifier circuits 810 and slave circuits 820 can be combined along with an inverter 851 to create a clocked level shifter 850 that actively drives the output signal during both phases of the clock signal. First, the input signal, in, is provided to an inverter 851 supplied in the first voltage domain to provide an inverted input signal, $\overline{in}$. The differential input signal, in/$\overline{in}$, is provided to a first sense amplifier circuit 810 that generates a first set of pulsed output signals s0N/s0P. The first sense amplifier circuit 810 is driven by a first clock signal, clkN, of a differential clock signal, clkN/clkP. The first set of pulsed output signals are input to a first slave circuit 820, which drives the output signal when the first clock signal, clkN, is high. Similarly, the differential input signal, in/$\overline{in}$, is provided to a second sense amplifier circuit 810 that generates a second set of pulsed output signals s1N/s1P. The second sense amplifier circuit 810 is driven by a second clock signal, clkP, of the differential clock signal, clkN/clkP. The second set of pulsed output signals are input to a second slave circuit 820, which drives the output signal when the second clock signal, clkP, is high. So, the top half of the clocked level shifter 850 drives the output signal during a first phase of the clock signal and the bottom half of the clocked level shifter 850 drives the output signal during a second phase of the clock signal.

Figure 8D:
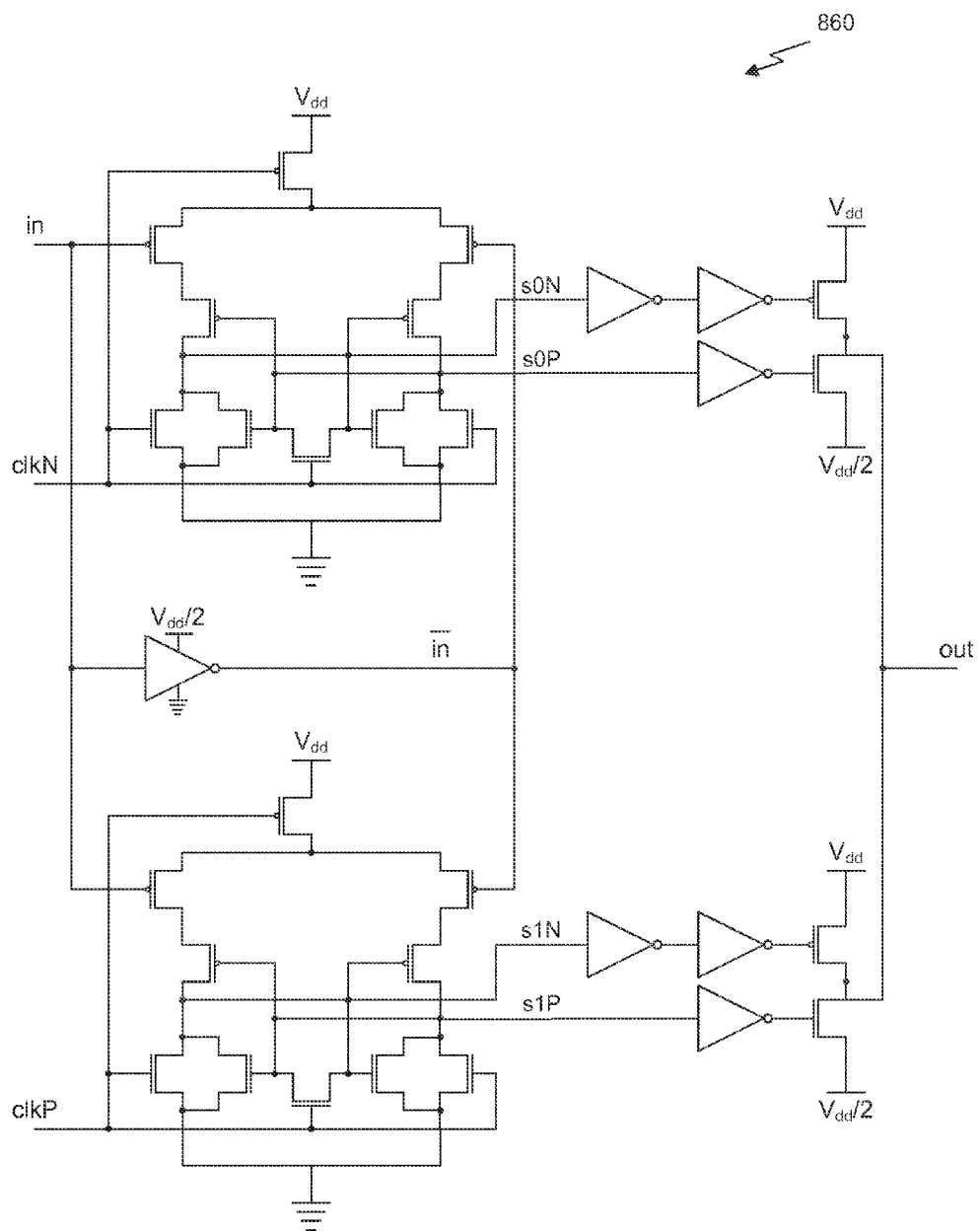

It will be appreciated that the clocked level shifter 850 converts an input signal in the first voltage domain into an output signal in the second voltage domain. As shown in FIG. 8D, a clocked level shifter 860 converts an input signal in the second voltage domain into an output signal in the first voltage domain. The output level shifter 860 may be created by switching the polarities of the transistors in the sense amplifier circuits (e.g., by using a P-type differential amplifier and pre-charging the output signals to a low supply voltage), supplying the inverter coupled to the input signal with a supply voltage in the second voltage domain, and supplying the slave circuits with a supply voltage in the first voltage domain.

The clocked level shifter 850 may be implemented in the link 300 as level shifters 321 and 323 or link 400 as level shifters 421 and 423 to shift the signal from the first voltage domain to the second voltage domain. Similarly, the clocked level shifter 860 may be implemented in the link 300 as level shifters 322 and 324 or link 400 as level shifters 422 and 424 to shift the signal from the second voltage domain to the first voltage domain. In addition, the differential clock signals may be transmitted along the links 300 or 400 and supplied to the clocked level shifters 850 & 860. The differential clock signal is a full-swing signal (e.g., logic high is equal to a high supply voltage and logic low is equal to a low supply voltage). The differential clock signal may also be actively repeated at the end of each segment of a link by routing the differential clock signal through a pair of buffers or a pair of inverters. Thus, the time delay associated with the differential clock signal may be reduced within the link.

In another embodiment, the differential clock signals may be transmitted separately from the links, such as by utilizing a global clock signal. In yet another embodiment, the differential clock signal may be generated by passing a single-ended signal through an inverter to generate a differential clock signal at the clocked level shifter. For example, a single, global clock signal may be coupled to an inverter at the link to generate an inverted clock signal that, along with the clock signal, is utilized as the differential clock signal.

Figure 9A:
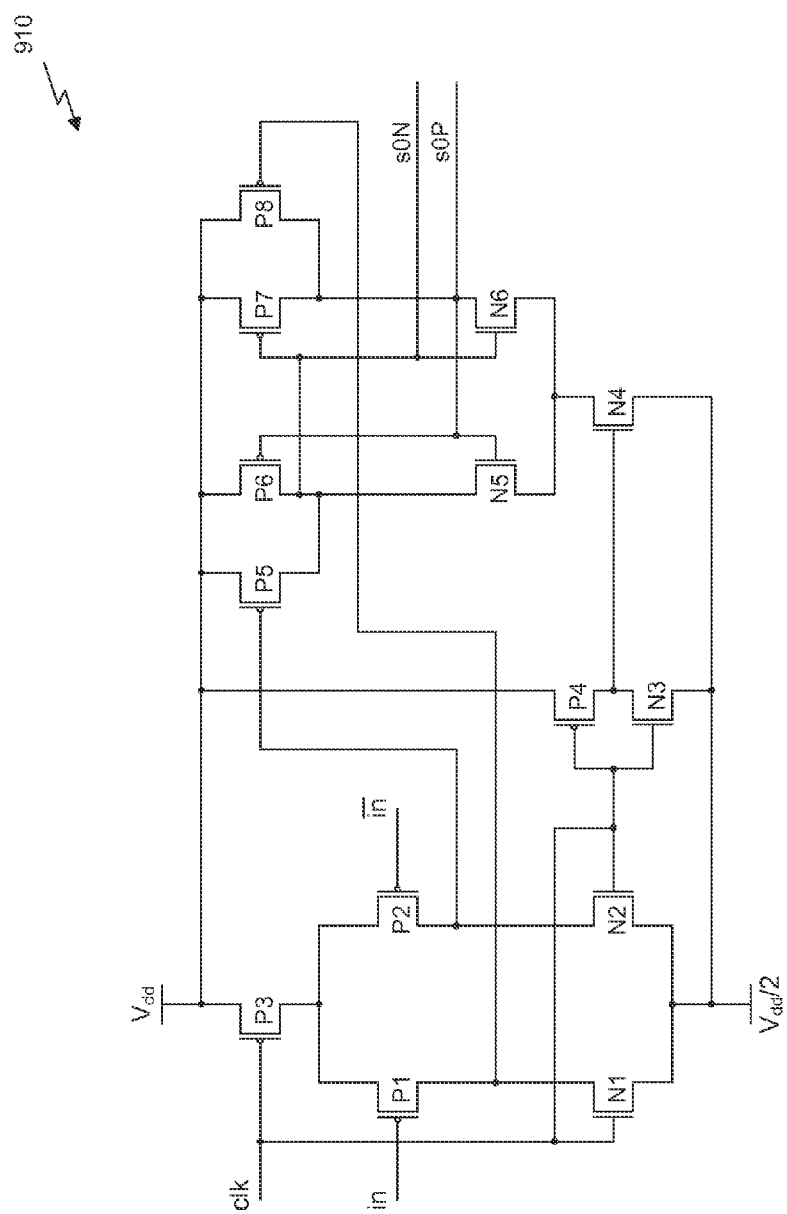
FIGS. 9A and 9B illustrate sense amplifier circuits, in accordance with another embodiment.
Figure 9B:
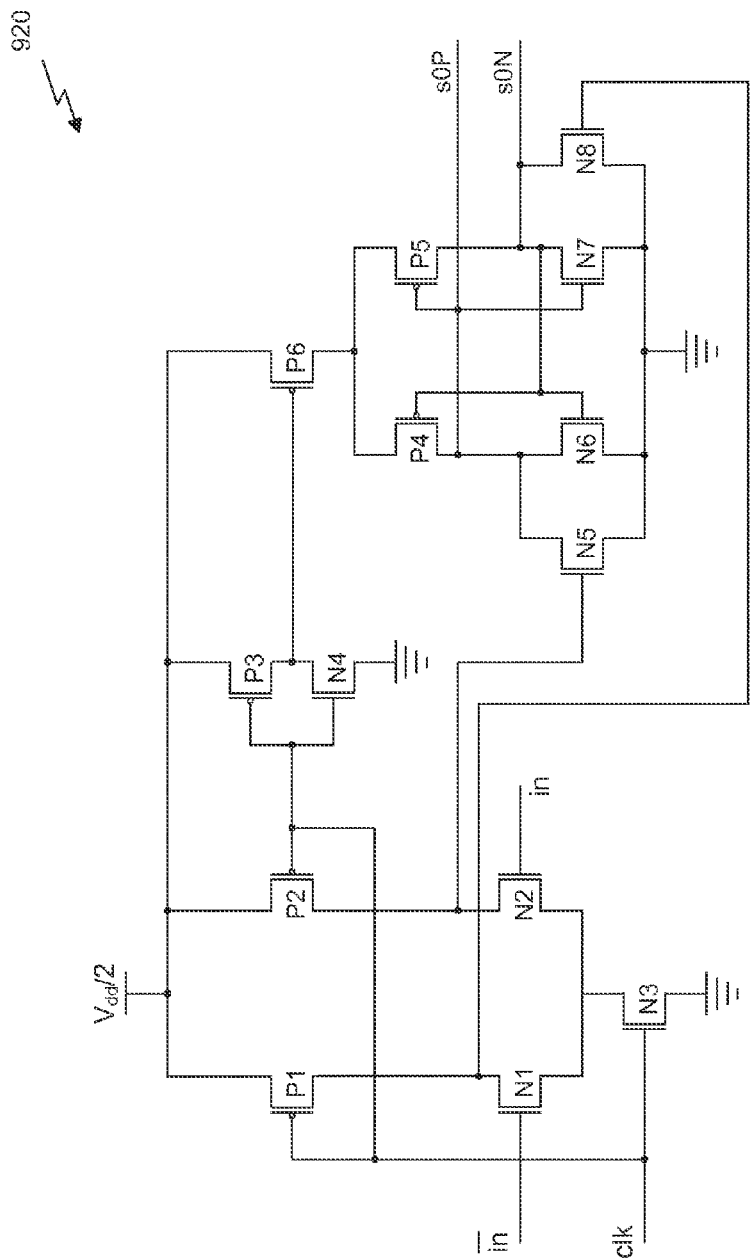

FIGS. 9A and 9B illustrate sense amplifier circuits 910 and 920, in accordance with another embodiment. The sense amplifier circuit 910, as shown in FIG. 9A, operates in the first voltage domain and sense amplifier circuit 920, as shown in FIG. 9B, operates in the second voltage domain. The sense amplifier circuits 910 and 920 may replace the sense amplifier circuits 810 in the level shifters 850 and 860. It will be appreciated that the sense amplifier circuits 910 and 920 operate in one of the two voltage domains whereas sense amplifier circuit 810 operates in the full-swing voltage domain characterized by the high supply voltage ($V_{dd}$) and the low supply voltage ($V_{ss}$).

As shown in FIG. 9A, the sense amplifier circuit 910 includes a PMOS transistor P3 having a gate coupled to a clock signal clk. The clock signal is also tied to the gates of two NMOS transistors N1 and N2. A differential input signal is tied to PMOS transistors P1 and P2. In operation, when the clock signal is logic high, the pulsed output signals s0N/s0P are pulled up to the high supply voltage ($V_{dd}$). When the clock signal is logic low, one of the pulsed output signals is pulled down to the mid-range supply voltage ($V_{dd}/2$), depending on a state of the input signal.

As shown in FIG. 9B, the sense amplifier circuit 920 includes a NMOS transistor N3 having a gate coupled to a clock signal clk. The clock signal is also tied to the gates of two PMOS transistors P1 and P2. A differential input signal is tied to NMOS transistors N1 and N2. In operation, when the clock signal is logic low, the pulsed output signals s0N/s0P are pulled up to the mid-range supply voltage ($V_{dd}/2$). When the clock signal is logic high, one of the pulsed output signals is pulled down to the low supply voltage (Vs), depending on a state of the input signal.

Again, the sense amplifier circuits 910 and 920 may replace sense amplifier circuits 810 in level shifters 850 and 860, where one of the differential clock signals clkP/clkN are supplied as the clock signal clk of the sense amplifier circuits 910 and 920 and the pulsed output signals s0N/s0P are coupled to the inputs of the inverters of the slave circuits 820.

Figure 10:
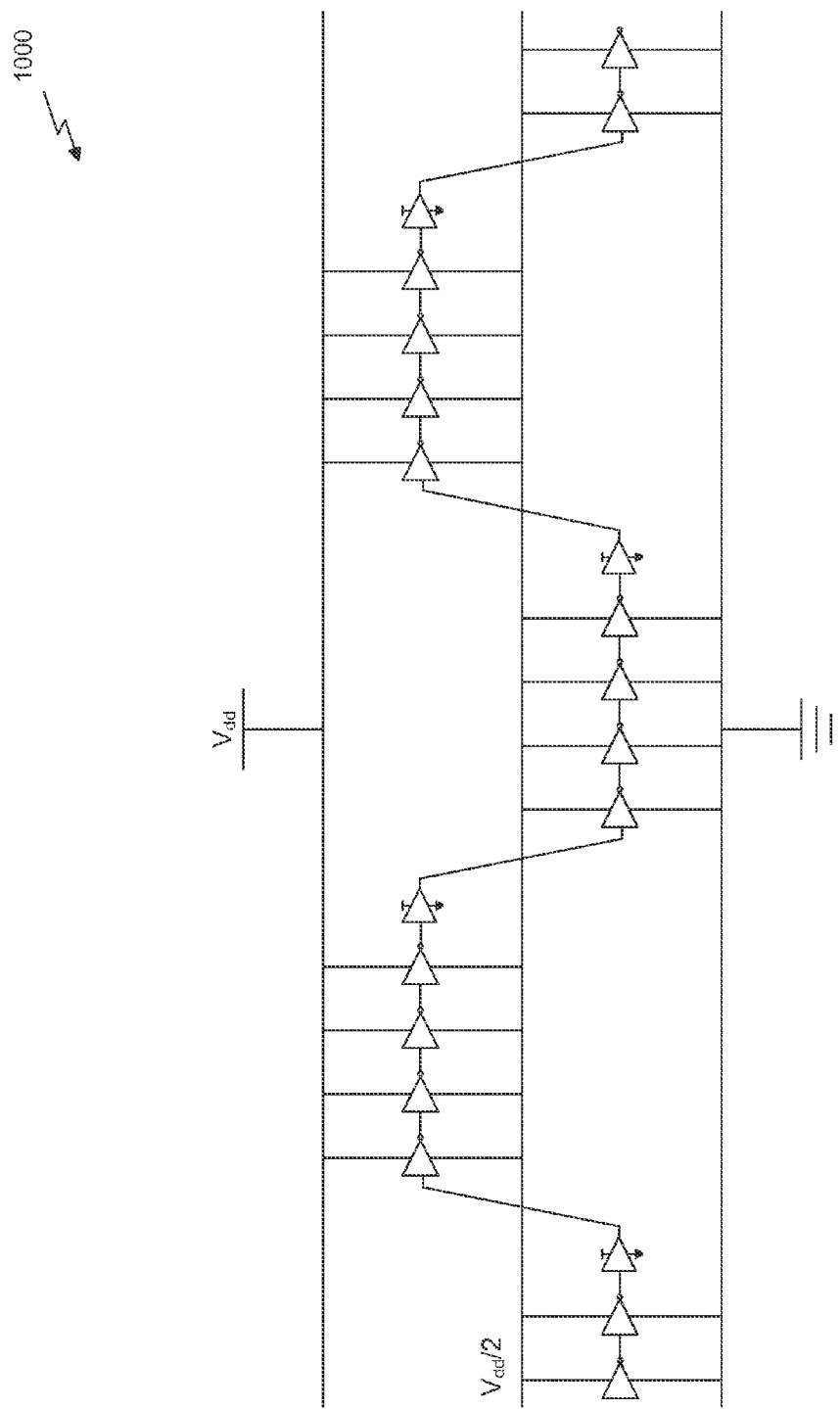
FIG. 10 illustrates a balanced, charge-recycling repeater link, in accordance with yet another embodiment.

FIG. 10 illustrates a balanced, charge-recycling repeater link 1000, in accordance with yet another embodiment. As shown in FIG. 10, the link 1000 includes an odd number of segments, where the first and last segment include half the number of active circuit elements and corresponding interconnects as all the other segments of the link. For example, the link 1000 includes a first segment in the second clock domain including two inverters and one level shifter, a second segment in the first clock domain including four inverters and one level shifter, a third segment in the second clock domain including four inverters and one level shifter, a fourth segment in the first clock domain including four inverters and one level shifter, and a fifth segment in the second clock domain including two inverters. In other words, a first segment and a second segment located at the beginning and end of the link, respectively, may include half the number of active circuit elements as the other segments in the link. The arrangement of active circuit elements and level shifters in this manner substantially balances the current paths on the link such that voltage droop in the mid-range voltage supply at the beginning and end of the link is reduced. The number of repeaters (i.e., active circuit elements) in the first voltage domain is equal to the number of repeaters in the second voltage domain in the link 1000. It will be appreciated that only the circuit elements for one signal are shown, but link 1000 may include circuit elements in the first and second voltage domains for a second signal as well. It will also be appreciated that the link 1000 may include an even number of segments, where the first and last segment include half the number of active circuit elements and corresponding interconnects as all the other segments of the link 1000, as long as the number of active circuit elements in the first voltage domain is equal to the number of active circuit elements in the second voltage domain.

Figure 11:
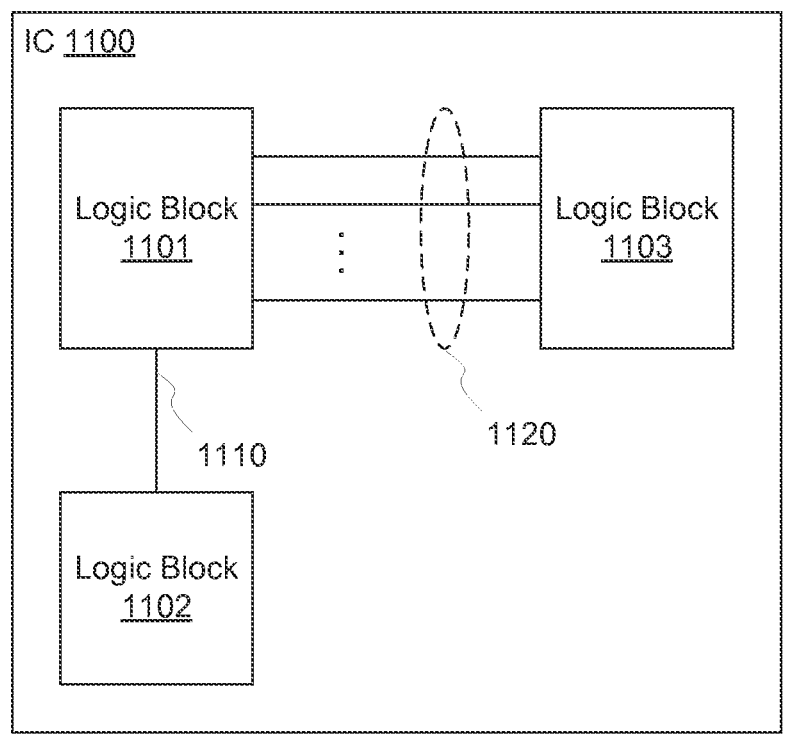
FIG. 11 illustrates an integrated circuit that includes a plurality of balanced, charge-recycling links, in accordance with one embodiment.

FIG. 11 illustrates an integrated circuit 1100 that includes a plurality of balanced, charge-recycling links, in accordance with one embodiment. The integrated circuit 1100 may be formed in a silicon substrate and include logic such as CMOS logic. The integrated circuit 1100 may be a central processing unit (CPU), a graphics processing unit (GPU), a vector processing unit (VPU), an application specific integrated circuit (ASIC), or the like. The IC 1100 may include a plurality of logic blocks (e.g., 1101, 1102, 1103, etc.). The logic blocks may comprise an arithmetic logic unit (ALU) or a scheduling unit, for example, of the IC 1100. Data may be transmitted between the logic blocks via interconnects routed on the IC 1100.

As shown in FIG. 11, a signal (or a pair of signals) may be transmitted from logic block 1101 to logic block 1102 via a balanced, charge-recycling link 1110. The link 1110 may be implemented as any of links 300, 400, or 500. It will be appreciated that the link 1110 includes two channels such that two signals can be transmitted over the link 1110 simultaneously.

As also shown in FIG. 11, a plurality of signals may be transmitted from logic block 1101 to logic block 1103 via a plurality of balanced, charge-recycling links 1120. In other words, multiple links 300, 400, or 500 may be implemented in parallel in order to transmit any number of signals from one logic block to another.

Figure 12:
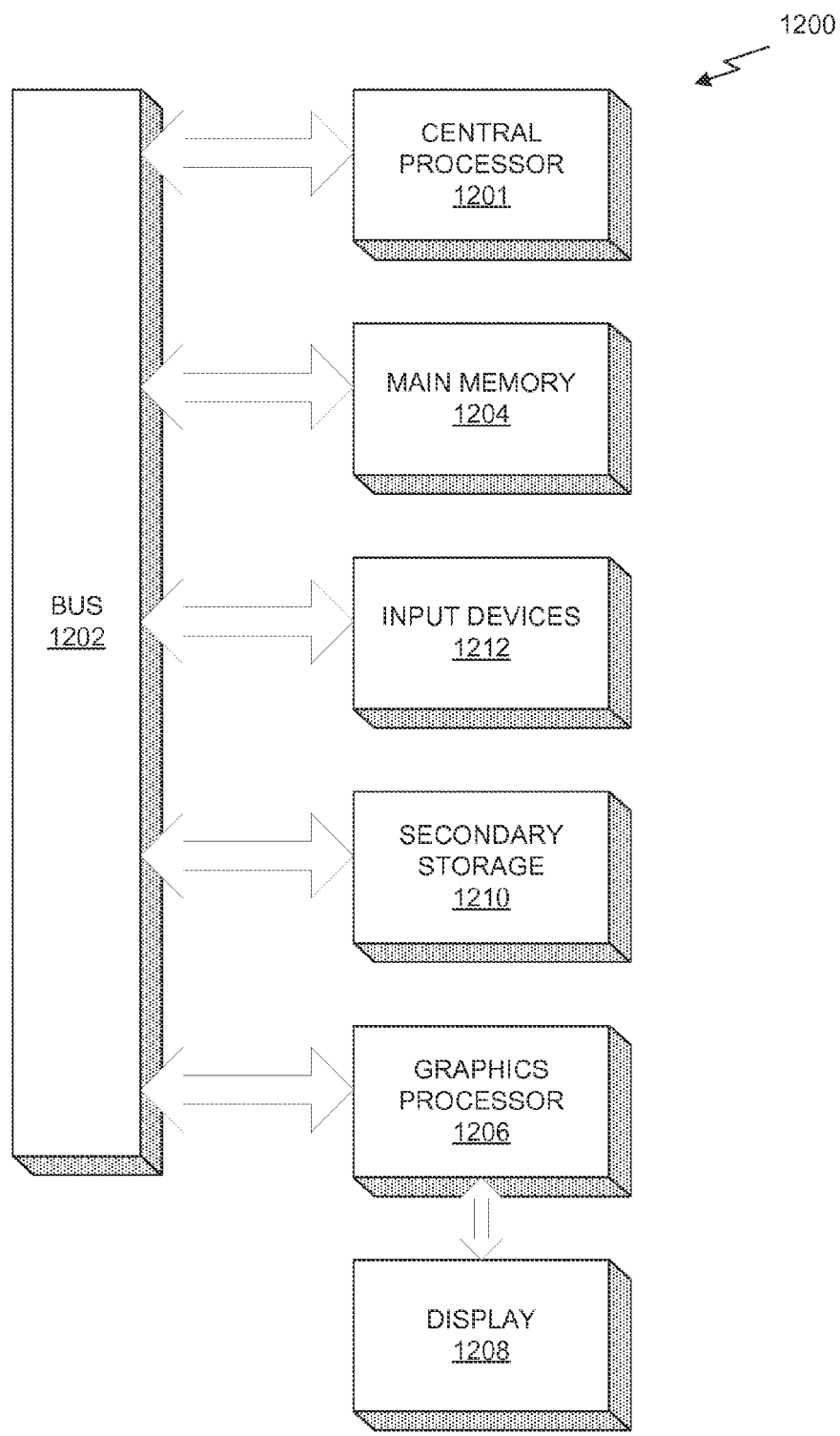
FIG. 12 illustrates an exemplary system in which the various architecture and/or functionality of the various previous embodiments may be implemented.

FIG. 12 illustrates an exemplary system 1200 in which the various architecture and/or functionality of the various previous embodiments may be implemented. As shown, a system 1200 is provided including at least one central processor 1201 that is connected to a communication bus 1202. The communication bus 1202 may be implemented using any suitable protocol, such as PCI (Peripheral Component Interconnect), PCI-Express, AGP (Accelerated Graphics Port), HyperTransport, or any other bus or point-to-point communication protocol(s). The system 1200 also includes a main memory 1204. Control logic (software) and data are stored in the main memory 1204 which may take the form of random access memory (RAM).

The system 1200 also includes input devices 1212, a graphics processor 1206, and a display 1208, i.e. a conventional CRT (cathode ray tube), LCD (liquid crystal display), LED (light emitting diode), plasma display or the like. User input may be received from the input devices 1212, e.g., keyboard, mouse, touchpad, microphone, and the like. In one embodiment, the graphics processor 1206 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 1200 may also include a secondary storage 1210. The secondary storage 1210 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 1204 and/or the secondary storage 1210. Such computer programs, when executed, enable the system 1200 to perform various functions. The memory 1204, the storage 1210, and/or any other storage are possible examples of computer-readable media.

In one embodiment, the architecture and/or functionality of the various previous figures may be implemented in the context of the central processor 1201, the graphics processor 1206, an integrated circuit (not shown) that is capable of at least a portion of the capabilities of both the central processor 1201 and the graphics processor 1206, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 1200 may take the form of a desktop computer, laptop computer, server, workstation, game consoles, embedded system, and/or any other type of logic. Still yet, the system 1200 may take the form of various other devices including, but not limited to a personal digital assistant (PDA) device, a mobile phone device, a television, etc.

Further, while not shown, the system 1200 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A balanced, charge-recycling repeater link, comprising:
a first set of segments operating in a first voltage domain; and
a second set of segments operating in a second voltage domain,
wherein the link is configured to transmit a first signal over at least one segment in the first set of segments and at least one other segment in the second set of segments, and
wherein each segment of the link includes:
at least one active circuit element configured to charge or discharge one or more corresponding interconnects within the link, and
a clocked level shifter configured to shift the level of a signal from the first voltage domain to the second voltage domain or the second voltage domain to the first voltage domain, wherein the clocked level shifter includes a pair of sense amplifier circuits and a pair of slave circuits to decouple the sense amplifier circuits from an output signal.

2. The balanced, charge-recycling repeater link of claim 1, wherein the first voltage domain is characterized by a high logic state represented by a high supply voltage and a low logic state represented by a mid-range supply voltage, and wherein the second voltage domain is characterized by a high logic state represented by the mid-range supply voltage and a low logic state represented by a low supply voltage.

3. The balanced, charge-recycling repeater link of claim 2, wherein the mid-range supply voltage is a potential halfway between a potential of the high supply voltage and a potential of the low supply voltage.

4. The balanced, charge-recycling repeater link of claim 1, wherein each active circuit element in the at least one active circuit element comprises a CMOS inverter.

5. The balanced, charge-recycling repeater link of claim 1, wherein the at least one active circuit element comprises a plurality of inverters configured to charge or discharge a plurality of corresponding interconnects within the segment.

6. The balanced, charge-recycling repeater link of claim 1, wherein the level shifters included in the first set of segments are configured to shift the level of the signal from the first voltage domain to the second voltage domain, and wherein the level shifters included in the second set of segments are configured to shift the level of the signal from the second voltage domain to the first voltage domain.

7. The balanced, charge-recycling repeater link of claim 1, wherein the sense amplifier circuits are supplied by a full-swing voltage domain characterized by a high supply voltage and a low supply voltage.

8. The balanced, charge-recycling repeater link of claim 1, wherein the level shifters comprise at least one of a current mirror level shifter, a cross-coupled pair level shifter, and a capacitively-coupled level shifter.

9. The balanced, charge-recycling repeater link of claim 1, wherein a first segment at the beginning of the balanced, charge-recycling repeater link and a second segment at the end of the balanced, charge-recycling repeater link include half a number of active circuit elements as each of the other segments in the first set of segments and the second set of segments.

10. An integrated circuit, the integrated circuit comprising:
a first logic block; and
a second logic block coupled to the first logic block via a balanced, charge-recycling repeater link that includes:
a first set of segments operating in a first voltage domain, and
a second set of segments operating in a second voltage domain,
wherein the link is configured to transmit a first signal over at least one segment in the first set of segments and at least one other segment in the second set of segments, and
wherein each segment of the link includes:
at least one active circuit element configured to charge or discharge one or more corresponding interconnects within the link, and
a clocked level shifter configured to shift the level of a signal from the first voltage domain to the second voltage domain or the second voltage domain to the first voltage domain, wherein the clocked level shifter includes a pair of sense amplifier circuits and a pair of slave circuits to decouple the sense amplifier circuits from an output signal.

11. The integrated circuit of claim 10, wherein the first voltage domain is characterized by a high logic state represented by a high supply voltage and a low logic state represented by a mid-range supply voltage, and wherein the second voltage domain is characterized by a high logic state represented by the mid-range supply voltage and a low logic state represented by a low supply voltage.

12. The integrated circuit of claim 11, wherein the mid-range supply voltage is a potential halfway between a potential of the high supply voltage and a potential of the low supply voltage.

13. The integrated circuit of claim 10, wherein each active circuit element in the at least one active circuit element comprises a CMOS inverter.

14. The integrated circuit of claim 10, wherein the at least one active circuit element comprises a plurality of inverters configured to charge or discharge a plurality of corresponding interconnects within the segment.

15. The integrated circuit of claim 10, wherein the level shifters included in the first set of segments are configured to shift the level of the signal from the first voltage domain to the second voltage domain, and wherein the level shifters included in the second set of segments are configured to shift the level of the signal from the second voltage domain to the first voltage domain.

16. The integrated circuit of claim 10, wherein the level shifters comprise at least one of a current mirror level shifter, a cross-coupled pair level shifter, and a capacitively-coupled level shifter.

17. The integrated circuit of claim 10, wherein the first logic block is coupled to the second logic block via a plurality of balanced, charge-recycling repeater links operating in parallel.

18. A system, comprising:
a memory; and
a processor including:
  a first logic block; and
  a second logic block coupled to the first logic block via a balanced, charge-recycling repeater link that includes:
    a first set of segments operating in a first voltage domain, and
    a second set of segments operating in a second voltage domain,
    wherein the link is configured to transmit a first signal over at least one segment in the first set of segments and at least one other segment in the second set of segments, and
    wherein each segment of the link includes:
      at least one active circuit element configured to charge or discharge one or more corresponding interconnects within the link, and
      a clocked level shifter configured to shift the level of a signal from the first voltage domain to the second voltage domain or the second voltage domain to the first voltage domain, wherein the clocked level shifter includes a pair of sense amplifier circuits and a pair of slave circuits to decouple the sense amplifier circuits from an output signal.

19. The integrated circuit of claim 10, wherein the sense amplifier circuits are supplied by a full-swing voltage domain characterized by a high supply voltage and a low supply voltage.

20. The system of claim 18, wherein the level shifters included in the first set of segments are configured to shift the level of the signal from the first voltage domain to the second voltage domain, and wherein the level shifters included in the second set of segments are configured to shift the level of the signal from the second voltage domain to the first voltage domain.

* * * * *